United States Patent
Cho

(10) Patent No.: US 11,176,879 B2
(45) Date of Patent: Nov. 16, 2021

(54) FOLDABLE DISPLAY

(71) Applicant: LG Display Co., Ltd., Seoul (KR)

(72) Inventor: Changhun Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/723,767

(22) Filed: Dec. 20, 2019

(65) Prior Publication Data

US 2020/0202774 A1 Jun. 25, 2020

(30) Foreign Application Priority Data

Dec. 24, 2018 (KR) .................. 10-2018-0168437

(51) Int. Cl.
| | | |
|---|---|---|
| *G09G 3/3225* | (2016.01) | |
| *H01L 51/00* | (2006.01) | |
| *G09F 9/30* | (2006.01) | |
| *G06F 1/16* | (2006.01) | |

(52) U.S. Cl.
CPC ......... *G09G 3/3225* (2013.01); *G06F 1/1616* (2013.01); *G06F 1/1652* (2013.01); *G09F 9/301* (2013.01); *H01L 51/0097* (2013.01); *G09G 2300/0408* (2013.01); *G09G 2300/0426* (2013.01); *G09G 2310/027* (2013.01)

(58) Field of Classification Search
CPC ......... G09G 3/3225; G09G 2300/0408; G09G 2300/0426; G09G 2310/027; G09G 2310/0232; G09G 3/035; G09G 2330/021; G09G 3/3275; H01L 51/0097; G09F 9/301; G06F 1/1616; G06F 1/1652; Y02E 10/549

See application file for complete search history.

(56) References Cited

U.S. PATENT DOCUMENTS

2017/0084226 A1* 3/2017 Kang ................. G09G 3/20
2018/0367736 A1* 12/2018 Lombardi ............ G06F 1/1652

FOREIGN PATENT DOCUMENTS

KR 10-2018-0073351 A 7/2018

* cited by examiner

*Primary Examiner* — Mark W Regn
(74) *Attorney, Agent, or Firm* — Polsinelli PC

(57) ABSTRACT

A foldable display comprises a flexible display panel including a first screen, a second screen, and a foldable boundary region positioned between the first screen and the second screen; a first drive IC connected to data lines of the first screen and connected to data lines of a first boundary region to drive pixels of the first screen and the first boundary region; and a second drive IC connected to data lines of the second screen and connected to data lines of a second boundary region to drive pixels of the second screen and the second boundary region, wherein channels of the first drive IC and channels of the second drive IC are driven and shutdown in accordance with status on whether the first and second screens are driven.

19 Claims, 20 Drawing Sheets

FOLDABLE DISPLAY

CROSS REFERENCE TO RELATED APPLICATION

This application claims the benefit of Korean Patent Application No. 10-2018-0168437 filed on Dec. 24, 2018, which is hereby incorporated by reference in its entirety.

BACKGROUND

Field of the Disclosure

The present disclosure relates to a display device, and more particularly, to a foldable display having a foldable screen using a flexible display panel and a driving method for a foldable display.

Description of the Background

Electroluminescent display devices are roughly classified into an inorganic light-emitting display device and an organic light-emitting display device according to materials of emission layers. An active matrix type organic light-emitting display device includes organic light-emitting diodes (hereinafter referred to as "OLEDs") which spontaneously emit light and has the advantages of a high response speed, high emission efficiency, a high luminance and a wide viewing angle. An organic light-emitting display device includes OLEDs formed in respective pixels. The organic light-emitting display device has not only a high response speed, high emission efficiency, a high luminance and a wide viewing angle but also a high contrast ratio and high color reproducibility because it can represent black gray scale as full black.

The organic light-emitting display device does not have liquid crystal and a back light unit. Pixels of the organic light-emitting display device can be formed on a plastic substrate, a thin glass substrate and a metal substrate formed of flexible materials. Accordingly, the organic light-emitting display device is suitable for flexible displays.

Flexible displays have screens whose sizes can be varied through a method of bending or folding a flexible display panel. A flexible display may be implemented as a rollable display, a bendable display, a foldable display, a slidable display, or the like. Such flexible displays can be applied to TV, vehicle displays, wearable devices and the liked as well as mobile devices such as smartphones and tablet PCs and applications thereof are expanding.

SUMMARY

The present disclosure provides a foldable display that has a screen size that can be varied by folding or unfolding a flexible display panel. Further, the present disclosure provides a foldable display that is easily carried and that allows for images to be viewed through a large screen.

A foldable display of the present disclosure includes: a flexible display panel including a first screen, a second screen, and a foldable boundary region positioned between the first screen and the second screen; a first drive IC connected to data lines of the first screen and connected to data lines of a first boundary region neighboring the first screen in the foldable boundary region to drive pixels of the first screen and the first boundary region; and a second drive IC connected to data lines of the second screen and connected to data lines of a second boundary region neighboring the second screen in the boundary region to drive pixels of the second screen and the second boundary region.

The foldable display may further comprise a host system configured to drive and/or shutdown of channels of the first drive IC and channels of the second drive IC according to whether the first and second screens are driven.

When only the first screen between the first and second screens is driven, channels connected to the data lines of the first screen may be driven in the first drive IC. Channels connected to the data lines of the first boundary region may be shut down in the first drive IC, and all channels of the second drive IC may be shut down.

In other words, the host system may be configured to: when only the first screen among the first and second screens is driven, drive channels of the first drive IC connected to the data lines of the first screen, and shut down channels of the first drive IC connected to the first boundary region, and shut down all channels of the second drive IC, and/or when only the second screen among the first and second screens is driven, drive channels of the second drive IC connected to the data lines of the second screen, and shut down channels of the second drive IC connected to the second boundary region, and shut down all channels of the first drive IC.

The host system may further be configured to: when both the first and second screens are simultaneously driven, drive channels of the first drive IC connected to the data lines of the first screen and the first boundary region, and drive channels of the second drive IC connected to the data lines of the second screen and the second boundary region.

The host system may be configured to control driving of the first screen and the second screen based on a posture or a folding degree of the flexible display panel and/or based on whether the first screen and/or the second screen are viewed by a user and/or based on a user input or command.

The host system may be configured to transmit an enable signal to the first and second drive ICs.

The enable signal may include a bit indicating whether the first screen is driven, a bit indicating whether the second screen is driven, and a bit indicating whether the first and second screens are simultaneously driven.

When the first and second screens are simultaneously driven, the first drive IC may be configured to change gray scales of pixel data to be written to pixels outside a predetermined curved line to black gray scale in a first left corner pixel region of the first screen distant from the boundary region among the first left corner pixel region and a first right corner pixel region of the first screen neighboring the boundary region. The second drive IC may be configured to change gray scales of pixel data to be written to pixels outside a predetermined curved line to black gray scale in a second right corner pixel region of the second screen distant from the boundary region among the second right corner pixel region and a second left corner pixel region of the second screen neighboring the boundary region.

When only the first screen among the first and second screens is driven, the first drive IC may be configured to change gray scales of pixel data to be written to pixels outside the predetermined curved lines to black gray scale in the first left corner pixel region and the first right corner pixel region.

When only the second screen among the first and second screens is driven, the second drive IC may be configured to change gray scales of pixel data to be written to pixels outside the predetermined curved lines to black gray scale in the second left corner pixel region and the second right corner pixel region.

The foldable display may further comprise: a first gate driver configured to provide gate signals to gate lines of the flexible display panel in response to a gate control signal from the first drive IC; and a second gate driver configured to provide gate signals to gate lines of the flexible display panel in response to a gate control signal from the second drive IC.

When only the first screen among the first and second screens is driven, the host system may be configured to drive the first gate driver and to shut down the second gate driver.

When only the second screen among the first and second screens is driven, the host system may be configured to drive the second gate driver and to shut down the first gate driver.

When the first and second screens are simultaneously driven, the first gate driver may be configured to provide a gate signal at one end of each of the gate lines, the second gate driver is configured to provide the gate signal at the other end of each of the gate lines so that the gate signal is simultaneously applied to one gate line from both ends thereof.

The first screen may further include a (1-1)-th screen close to the boundary region and a (1-2)-th screen separated from the boundary region having the (1-1)-th screen disposed therebetween.

The second screen may include a (2-1)-th screen close to the boundary region and a (2-2)-th screen separated from the boundary region having the (2-1)-th screen disposed therebetween.

The first driver may include a (1-1)-th drive IC connected to data lines of the (1-1)-th screen and connected to data lines of the first boundary region neighboring the first screen so as to drive pixels of the first screen and the first boundary region, and a (1-2)-th drive IC connected to data lines of the (1-2)-th screen so as to drive the (1-2)-th screen.

The second driver may include a (2-1)-th drive IC connected to data lines of the (2-1)-th screen and connected to data lines of the second boundary region neighboring the second screen to drive pixels of the second screen and the second boundary region, and a (2-2)-th drive IC connected to data lines of the (2-2)-th screen so as to drive the (2-2)-th screen, The host system may be configured to: when only the first screen among the first and second screens is driven, drive channels connected to the data lines of the (1-1)-th screen among channels of the (1-1)-th drive IC, and shut down channels connected to the data lines of the first boundary region among the channels of the (1-1)-th drive IC, and shut down all channels of the (1-2)-th, (2-1)-th and (2-2)-th drive ICs.

The host system may be configured to, when only the second screen between the first and second screens is driven, drive only channels connected to the data lines of the (2-1)-th screen among channels of the (2-1)-th drive IC, shut down channels connected to the data lines of the second boundary region among the channels of the (2-1)-th drive IC, and shut down all channels of the (2-2)-th, (1-1)-th and (1-2)-th drive ICs.

The host system may be configured to, when both the first and second screens are simultaneously driven, drive channels of the (1-1)-th and (1-2)-th drive ICs connected to the data lines of the first screen and the first boundary region, and drive channels of the (2-1)-th and (2-2)-th drive ICs connected to the data lines of the second screen and the second boundary region.

A foldable display according to another aspect of the present disclosure includes: a first driver for driving pixels of the first screen and pixels of a first boundary region neighboring the first screen in the foldable boundary region; and a second driver for driving pixels of the second screen and pixels of a second boundary region neighboring the second screen in the boundary region.

The first screen may include a (1-1)-th screen close to the boundary region and a (1-2)-th screen separated from the boundary region having the (1-1)-th screen disposed therebetween. The second screen includes a (2-1)-th screen close to the boundary region and a (2-2)-th screen separated from the boundary region having the (2-1)-th screen disposed therebetween.

The first driver may includes a (1-1)-th drive IC connected to data lines of the (1-1)-th screen and connected to data lines of the first boundary region neighboring the first screen in the foldable boundary region to drive pixels of the first screen and the first boundary region; and (1-2)-th drive IC connected to data lines of the (1-2)-th screen to drive pixels of the (1-2)-th screen.

The second driver may include a (2-1)-th drive IC connected to data lines of the (2-1)-th screen and connected to data lines of the second boundary region neighboring the second screen in the boundary region to drive pixels of the second screen and the second boundary region, and (2-2)-th drive IC connected to data lines of the (2-2)-th screen to drive pixels of the (2-2)-th screen.

Further, a driving method for a foldable display according to the present disclosure, the foldable display comprising: a flexible display panel including a first screen, a second screen, and a foldable boundary region positioned between the first screen and the second screen; a first drive IC connected to data lines of the first screen and connected to data lines of a first boundary region in the boundary region neighboring the first screen to drive pixels of the first screen and the first boundary region; and a second drive IC connected to data lines of the second screen and connected to data lines of a second boundary region in the boundary region neighboring the second screen to drive pixels of the second screen and the second boundary region, wherein the method comprises the following steps: when only the first screen among the first and second screens is driven, driving channels of the first drive IC connected to the data lines of the first screen, and shutting down channels of the first drive IC connected to the first boundary region, and shutting down all channels of the second drive IC and/or, when only the second screen among the first and second screens is driven, driving channels of the second drive IC connected to the data lines of the second screen, and shutting down channels of the second drive IC connected to the second boundary region, and shutting down all channels of the first drive IC.

The driving method may further include the step of, when both the first and second screens are simultaneously driven, driving channels of the first drive IC connected to the data lines of the first screen and the first boundary region, and driving channels of the second drive IC connected to the data lines of the second screen and the second boundary region.

The driving method may further include the steps: when only the first screen among the first and second screens is driven, driving a first gate driver for providing gate signals to gate lines of the foldable display panel and shutting down a second gate driver for providing gate signals to the gate lines and/or, when only the second screen among the first and second screens is driven, driving the second gate driver and shutting down the first gate driver.

The driving method may further include the step of: when the first and second screens are simultaneously driven, providing a gate signal at one end of each of the gate lines, providing the gate signal at the other end of each of the gate lines that the gate signal is simultaneously applied to one gate line from both ends thereof.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principles of the disclosure.

In the drawings.

DETAILED DESCRIPTION

Figure 1:
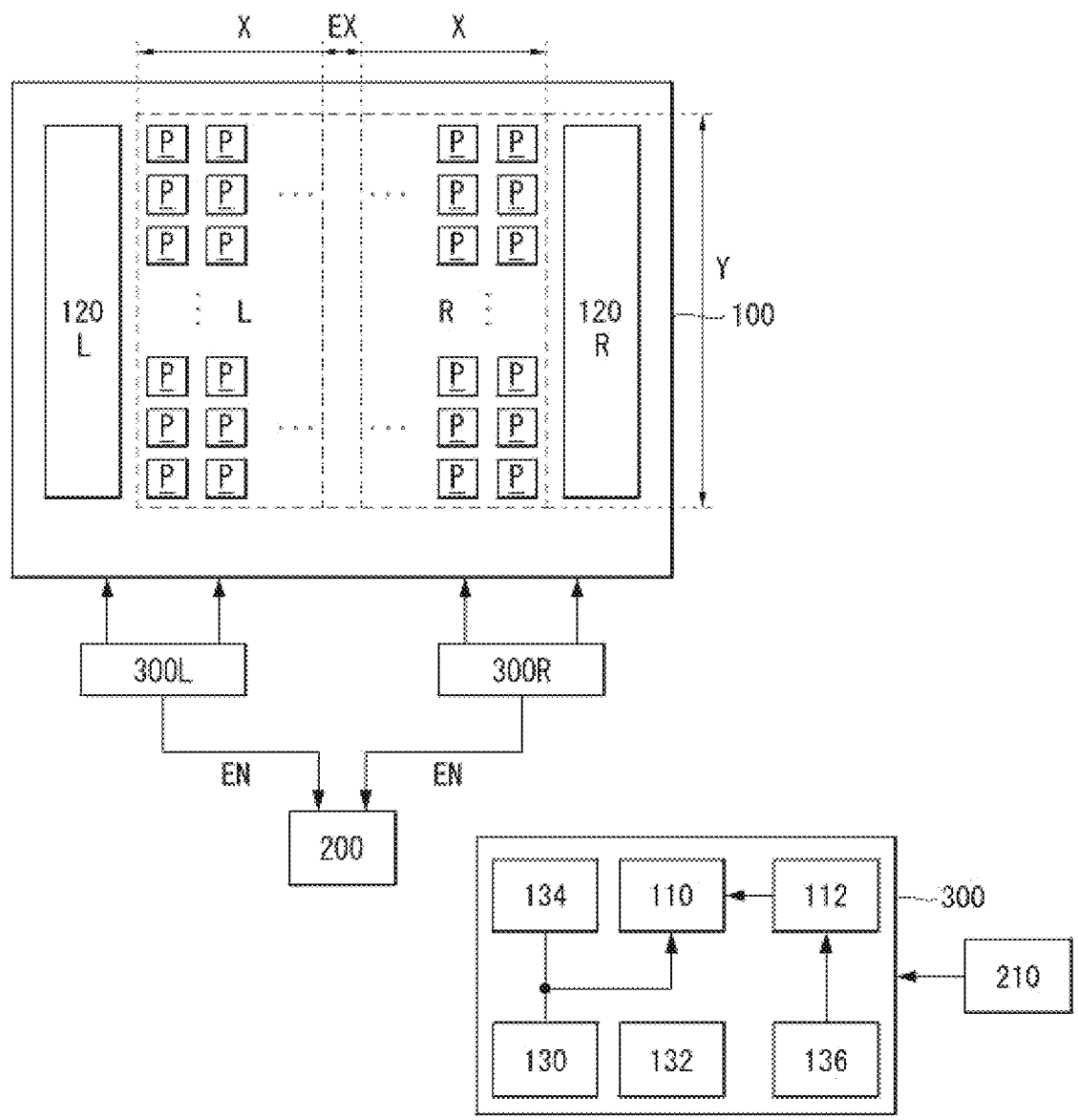
FIG. 1 is a block diagram showing a foldable display according to an aspect of the present disclosure.

The advantages, features and methods for accomplishing the same of the present disclosure will become more apparent through the following detailed description with respect to the accompanying drawings. However, the present disclosure is not limited by aspects described blow and is implemented in various different forms, and the aspects are provided so that this disclosure will be thorough and complete, and will fully convey the scope of the disclosure to those skilled in the art. The present disclosure is defined by the scope of the claims.

Shapes, sizes, ratios, angles, numbers, etc. shown in the figures to describe aspects of the present disclosure are exemplary and thus are not limited to particulars shown in the figures. Like numbers refer to like elements throughout the specification. It will be further understood that when the terms "include", "have" and "comprise" are used in this specification, other parts may be added unless "~ only" is used. An element described in the singular form is intended to include a plurality of elements unless context clearly indicates otherwise.

In interpretation of a component, the component is interpreted as including an error range unless otherwise explicitly described.

It will be understood that, when an element is referred to as being "on" or "under" another element, it can be "directly" on or under another element or can be "indirectly" formed such that an intervening element is also present.

In the following description of the aspects, "first" and "second" are used to describe various components, but such components are not limited by these terms. The terms are used to discriminate one component from another component. Accordingly, a first component mentioned in the following description may be a second component within the technical spirit of the present disclosure.

The same reference numbers will be used throughout this specification to refer to the same parts.

Features of aspects of the present disclosure can be coupled or combined partially or overall and technically interoperated in various manners, and the aspects may be implemented independently or associatively.

In a foldable display of the present disclosure, a pixel circuit and a gate driver may include a plurality of transistors. The transistors may be implemented as oxide thin film transistors (TFTs) including oxide semiconductor, low temperature polysilicon (LTPS) TFTs including LTPS, or the like. Each transistor may be implemented as a p-channel TFT or an n-channel TFT. Although an example in which transistors of the pixel circuit are implemented as p-channel TFTs will be described in aspects, the present disclosure is not limited thereto.

A transistor is a three-electrode element including a gate, a source and a drain. The source is an electrode which provides carriers to the transistor. Carriers flow from the source in the transistor. The drain is an electrode from which carriers flow to the outside from the transistor. Carriers flow from the source to the drain in the transistor. In the case of an n-channel transistor, a source voltage is lower than a drain voltage such that electrons can flow from the source to the drain because the electrons are carriers. In the n-channel transistor, a current flows from the drain to the source. In the case of a p-channel transistor (PMOS), a source voltage is higher than a drain voltage such that holes can flow from the source to the drain because the holes are carriers. In the p-channel transistor, holes flow from the source to the drain and thus a current flows from the source to the drain. It is noted that the source and the drain of a transistor are not fixed. For example, the source and the drain may be changed according to an applied voltage. Accordingly, the source and the drain of a transistor do not limit the disclosure. The source and the drain of a transistor will be referred to as first and second electrodes in the following description.

A gate signal swings between a gate-on voltage and a gate-off voltage. The gate-on voltage is set to a voltage higher than a threshold voltage of a transistor and the gate-off voltage is set to a voltage lower than the threshold voltage of the transistor. The transistor is turned on in response to the gate-on voltage and turned off in response to the gate-off voltage. In the case of an n-channel transistor, the gate-on voltage may be a gate high voltage (VGH) and the gate-off voltage may be a gate low voltage (VGL). In the case of a p-channel transistor, the gate-on voltage may be a gate low voltage (VGL) and the gate-off voltage may be a gate high voltage (VGH).

Hereinafter, various aspects of the present disclosure will be described in detail with reference to the drawings.

Referring to FIGS. 1 to 5, a foldable display of the present disclosure includes a flexible display panel 100, drive integrated circuits (ICs) 300L and 300R which provide data signals to data lines DL1 to DL6 of the flexible display panel 100, and gate drivers 120L and 120R which provide gate signals to gate lines GL1 and GL2 of the flexible display panel 100. In FIG. 1, a drive IC 300 shows an internal configuration of the first and second drives ICs 300L and 300R.

A screen on which an input image is reproduced in the flexible display panel 100 includes the data lines DL1 to DL6, the gate lines GL1 and GL2 which intersect the data lines DL1 to DL6, and a pixel array in which pixels P are arranged in a matrix form. The screen is divided into a first screen L driven by the first drive IC 300L and a second screen R driven by the second drive IC 300R.

The first screen L may be a left-half screen and the second screen R may be a right-half screen. When the first and second screens L and R are folded with respect to a folding boundary region EX, the resolution of one screen is X*Y. X is a resolution of each of the first and second screens L and R in the X-axis direction. Y is a resolution of each of the first and second screens L and R in the Y-axis direction. Y is greater than X/2.

When both the first and second screens L and R are driven in an unfolding state of the first and second screens L and R, the screen becomes larger to a maximum resolution. The maximum resolution is (2X+α)*Y. α is a resolution of the folding boundary region EX in the X-axis direction. Pixels P are arranged on the folding boundary region EX and thus an image is not cut off between the first and second screens L and R in an unfolding state of the first and second screens L and R.

Figure 4:
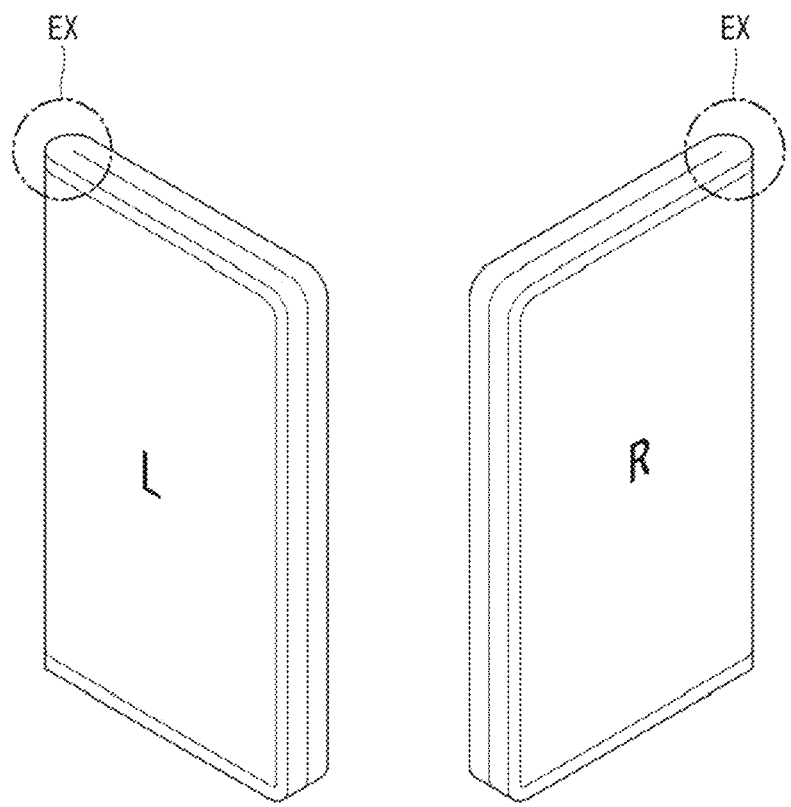
FIG. 4 is a diagram showing an example of folding a flexible display panel.

The flexible display panel 100 can be folded on the basis of the first and second screens L and R, as shown in FIG. 4, and the first and second screens L and R can be selectively driven. When the flexible display panel 100 is folded, it can be folded in an out folding manner in which the screens L and R are exposed to the outside.

Figure 5:
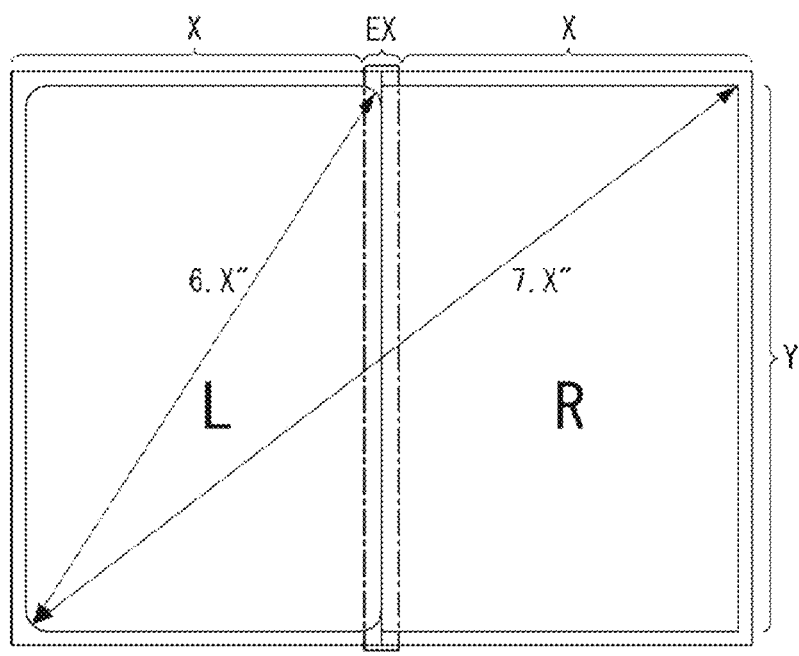
FIG. 5 is a diagram showing an example in which a screen size of a flexible display is variable.

As shown in FIG. 5, the size of the screen L or R is reduced to 6 inches (6.x") when any one of the first and second screens L and R is driven and the size of the screen L and R is increased to 7 inches (7.x") when both the first and second screens L and R are driven.

Each pixel P includes sub-pixels having different colors for color expression. Sub-pixels include a red sub-pixel (hereinafter referred to as an "R sub-pixel"), a green sub-pixel (hereinafter referred to as a "G sub-pixel") and a blue sub-pixel (hereinafter referred to as a "B sub-pixel"). Sub-pixels may further include a white sub-pixel which is not shown. Each sub-pixel may be implemented as a pixel circuit including an internal compensation circuit.

Figure 2:
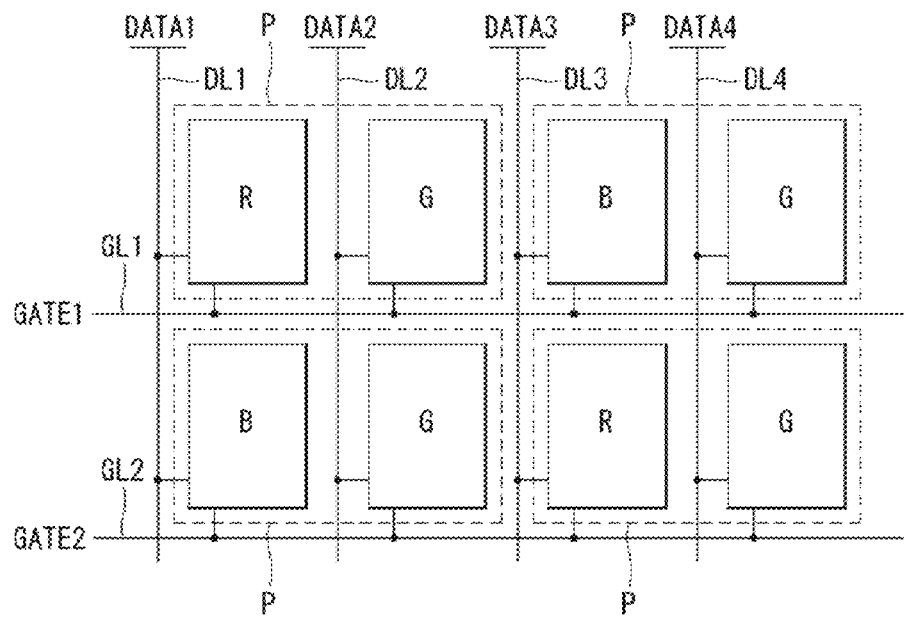
FIG. 2 is a diagram showing an example of pentile pixel arrangement.

Pixels P may be arranged as real color pixels or pentile pixels. In a pentile pixel structure, two sub-pixels having different colors are driven with one pixel P using a predetermined pentile pixel rendering algorithm, as shown in FIG. 2, to achieve higher resolution than that of real color pixels. A pentile pixel rendering algorithm compensates for insufficient color expression in each pixel P with colors of lights emitted from neighboring pixels. When X*Y=1440*2880 and X-axis resolution of the folding boundary region EX is 40, X*Y=1440*4*2880 and (2X+α)*Y=[(2880*4)+40]*2880 in the pentile pixel structure. Here, 4 represents R, G, B and G sub-pixels. The width of the folding boundary region EX, that is, the X-axis length is determined by the curvature of the folding boundary region EX. The resolution and size of the folding boundary region EX are proportional to the radius of curvature of the folding boundary region EX.

Figure 3:
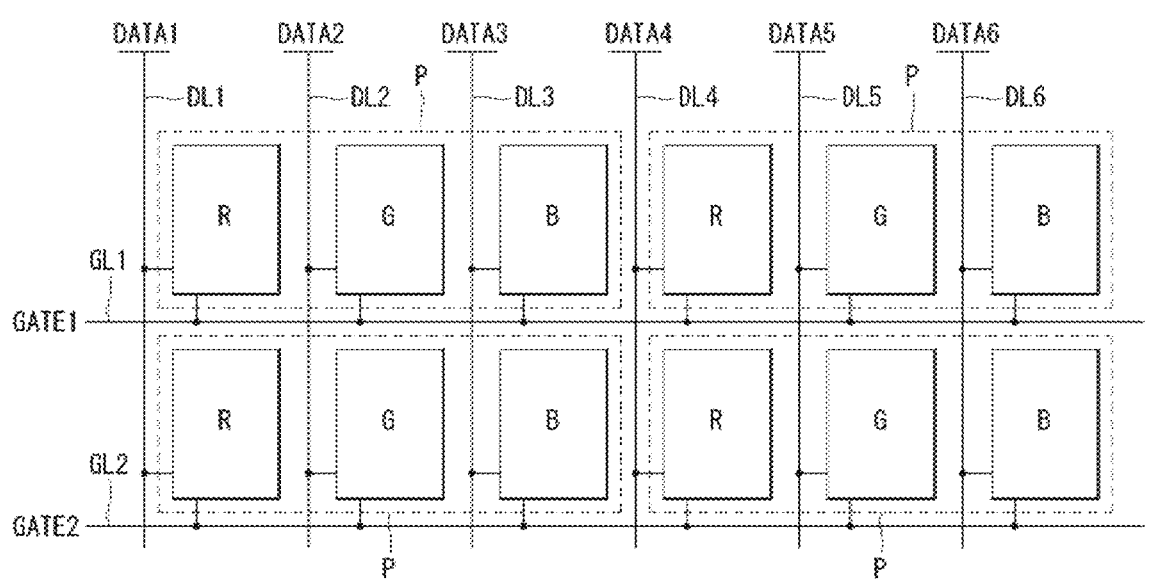
FIG. 3 is a diagram showing an example of real color pixel arrangement.

In a real color pixel structure, one pixel P is composed of R, G and B sub-pixels, as shown in FIG. 3.

Figure 6A:
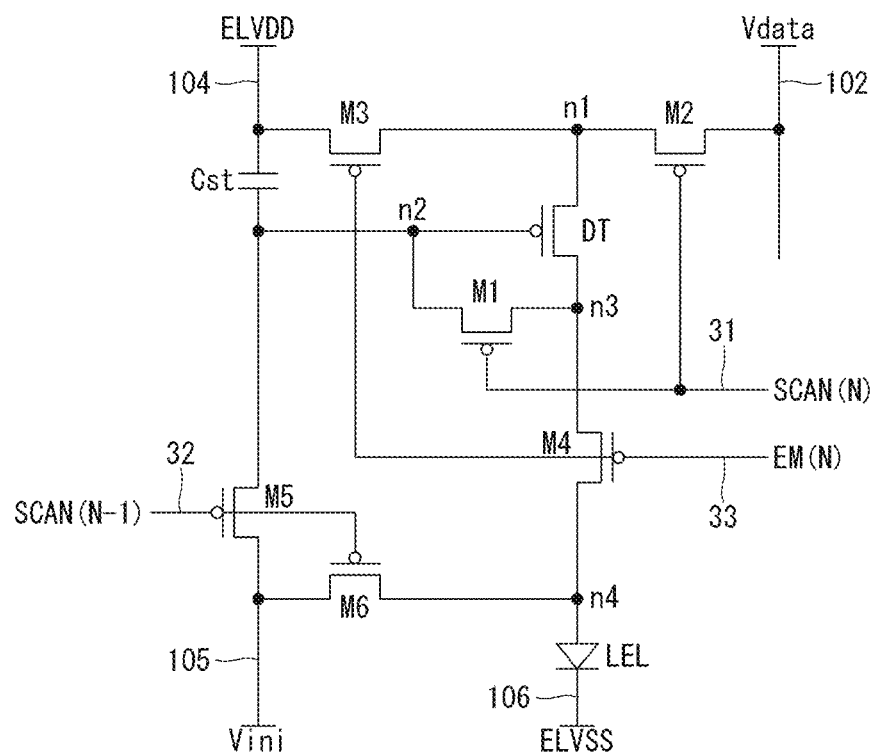
FIG. 6A is a circuit diagram showing an example of a pixel circuit.

The flexible display panel 100 may be implemented as a plastic OLED panel. The plastic OLED panel includes a pixel array on an organic thin film attached to a back plate. A touch sensor array may be formed on the pixel array. The back plate may be a polyethylene terephthalate (PET) substrate. The back plate blocks moisture permeation such that the pixel array is not exposed to humidity and supports the organic thin film on which the pixel array is formed. The organic thin film may be a thin polyimide (PI) film substrate. A multilayered buffer layer may be formed of insulating materials (not shown) may be formed on the organic thin film. Interconnection lines for providing power or signals applied to the pixel array 103 and the touch sensor array may be formed on the organic thin film. In the plastic OLED panel, a pixel circuit includes an OLED used as a light-emitting element LEL, a driving element for driving the OLED, a plurality of switch elements for switching current paths of the driving element and the OLED, and a capacitor connected to the driving element, as shown in FIG. 6A.

The first drive IC 300L drives the pixel array of the first screen L and some pixels of the folding boundary region EX. A part (hereinafter referred to as a "first boundary region") of the folding boundary region EX which is driven by the first drive IC 300L includes left-half pixels in the folding boundary region EX. In other words, the first boundary region driven by the first drive IC 300L includes pixels of the folding boundary region EX arranged adjacent to the first screen L. The second drive IC 300R drives the pixel array of the second screen R and the other pixels of the folding boundary region EX. The other part (hereinafter referred to as a "second boundary region") of the folding boundary region EX which is driven by the second drive IC 300R includes right-half pixels in the folding boundary region EX. In other words, the second boundary region driven by the second drive IC 300R includes pixels of the folding boundary region EX arranged adjacent to the second screen R.

The gate drivers 120L and 120R may be mounted along with the pixel array on the substrate of the flexible display panel 100. The gate drivers 120L and 120R may be implemented as gate in panel (GIP) circuits directly formed on the flexible display panel 100.

The gate driver 120L or 120R is disposed in one of left and right bezels of the flexible display panel 100 and can provide gate signals to the gate lines GL1 and GL2 through a single feeding method. Gate lines GL1 and GL2 are gate lines of the display panel. Each of the gate lines GL1 and GL2 may be connected a plurality of pixels of each of the first screen L, the second screen R and the boundary region EX, respectively. In this case, one of the gate drivers 120L and 120R in FIG. 1 is not necessary. In other words, the gate driver 120L may be arranged adjacent to the first screen L, and the gate driver 120R may be arranged adjacent to the second screen R.

Alternatively, the gate drivers 120L and 120R are respectively disposed in the left and right bezels of the flexible display panel 100 and can provide gate signals to the gate lines GL1 and GL2 through a double feeding method. In this double feeding method, gate signals are simultaneously applied to both ends of one gate line. The first gate driver 120L may be disposed in the left bezel of the flexible display panel 100 and the second gate driver 120R may be disposed in the right bezel of the flexible display panel 100.

The gate drivers 120L and 120R are driven according to gate control signals supplied from the drive ICs 300L and 300R using shift registers to sequentially provide gate signals GATE1 and GATE2 to the gate lines GL1 and GL2. The shift registers can sequentially provide the gate signals GATE1 and GATE2 to the gate lines GL1 and GL2 by shifting the gate signals GATE1 and GATE2. The gate signals GATE1 and GATE2 may include scan signals SCAN(N−1) and SCAN(N), an emission signal EM(N), and the like shown in FIG. 6B. The gate signals GATE1 and GATE2 swing between a gate-on voltage VGL and a gate off voltage VGH.

One or more of the first and second drive ICs 300L and 300R generate gate control signals for driving the gate drivers 120L and 120R. The gate control signals include gate timing signals such as a gate start pulse (GSP) signal and a gate shift clock (GSC) signal, and gate voltages such as the gate-on voltage VGL and the gate-off voltage VGH.

Each of the first and second drive ICs 300L and 300R includes a data driver 110, a gamma compensation voltage generator 112, a timing controller 130, a power supply 136, a second memory 132, and a level shifter 134. The first and second drive ICs 300L and 300R are connected to a host system 200, a first memory 210 and the flexible display panel 100.

The data driver 110 converts pixel data (digital signal) of an input image received from the timing controller 130 into gamma compensation voltages through a digital-to-analog converter (hereinafter referred to as "DAC") to output data signals DATA1 to DATA6. The DAC converts the pixel data into gamma compensation voltages to output voltages of the data signals DATA1 to DATA6 (hereinafter referred to as "data voltages"). The data voltages output from the data driver 110 are provided to data lines DL1 to DL6 of the pixel array through output buffers of data channels of the drive ICs 300L and 300R. The gamma compensation voltage generator 112 divides an input voltage from the power supply 136 through a voltage-dividing circuit to generate gamma compensation voltages for respective gray scales and provides the gamma compensation voltages to the data driver 110.

The timing controller 130 provides pixel data of an input image received from the host system 200 to the data driver 110. The timing controller 130 controls operation timing of the gate drivers 120L and 120R and the data driver 110 using timing signals received from the host system 200.

The level shifter 134 converts a low level voltage of a gate timing signal received from the timing controller 130 into the gate-on voltage VGL and converts a high level voltage of the gate timing signal into the gate-off voltage VGH. The gate timing signal and gate voltages output from the level shifter 134 are supplied to the gate drivers 120L and 120R through gate channels of the drive ICs 300L and 300R.

The power supply 136 generates power necessary to drive the pixel array and the gate drivers 120L and 120R of the flexible display panel 100, and the drive ICs 300L and 300R using a DC-DC converter. The DC-DC converter may include a charge pump, a regulator, a Buck converter, and a boost converter. The power supply 136 may generate DC voltages such as a gamma reference voltage, the gate-on voltage VGL, the gate-off voltage VGH, a pixel driving voltage ELVDD, a low power voltage ELVSS, and an initialization voltage Vini by adjusting a DC input voltage from the host system 200. The gamma reference voltage is supplied to the gamma compensation voltage generator 112. The gate-on voltage VGL and the gate-off voltage VGH are supplied to the level shifter 134 and the gate driver 120. Pixel voltages such as the pixel driving voltage ELVDD, the low power voltage ELVSS and the initialization voltage Vini are commonly supplied to the pixels P.

The gate voltages may be set as VGH=8V and VGL=−7V and the pixel voltages may be set as ELVDD=4.6V, ELVSS=−2 to −3V and Vini=−3V to −4V, but the present disclosure is not limited thereto. A data voltage Vdata may be set as Vdata=3 to 6V but the present disclosure is not limited thereto.

The second memory 132 stores compensation values, register setting data and the like received from the first memory when power is applied. The compensation values may be applied to various algorithms for picture quality improvement. The register setting data defines operations of the data driver 111, the timing controller 130 and the gamma compensation voltage generator 112. The first memory 210 may include a flash memory. The second memory 132 may include a static RAM (SRAM).

The host system 200 may be implemented as an application processor (AP) in a mobile device, a wearable device, a virtual reality device, augmented reality device, or the like. The host system 200 transmits pixel data of an input image and command code to the first and second drive ICs 300L and 300R through a mobile industry processor interface (MIPI). The host system 200 is not limited to the AP. For example, the host system 200 may be a main board of a television system, a set-top box, a navigation system, a personal computer (PC), a home theater system, or the like.

Figure 6B:
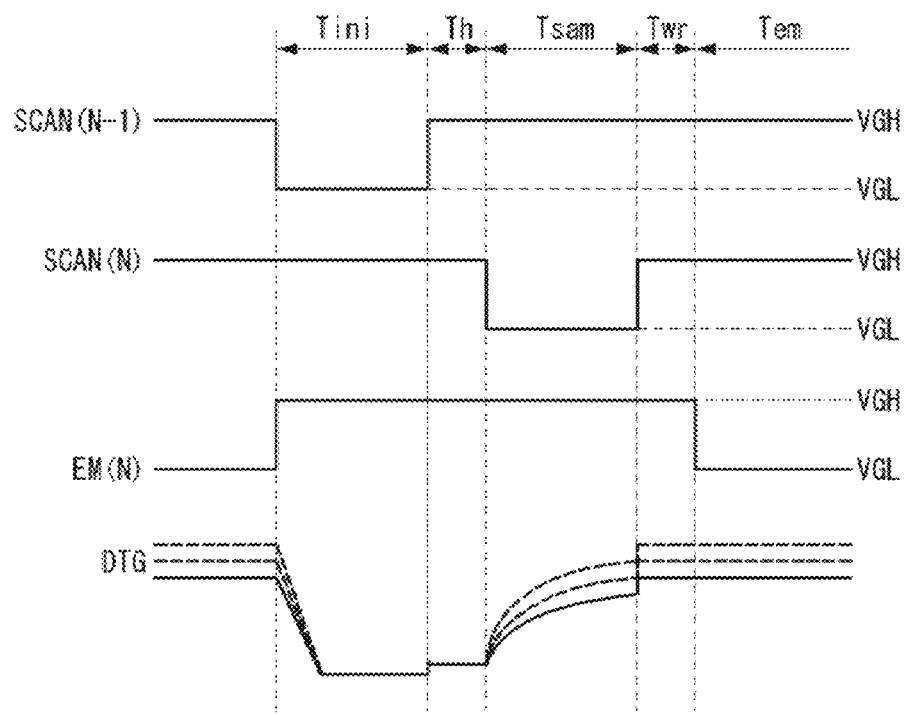
FIG. 6B is a diagram showing a method of driving the pixel circuit shown in FIG. 6A.

FIG. 6A is a circuit diagram showing an example of a pixel circuit. A pixel circuit of the present disclosure is not limited to FIG. 6A. FIG. 6B is a diagram showing a method of driving the pixel circuit shown in FIG. 6A.

Referring to FIGS. 6A and 6B, the pixel circuit includes a light-emitting element LEL, a driving element DT which provides current to the light-emitting element LEL, and an internal compensation circuit which compensates for a gate voltage of the driving element DT by a threshold voltage Vth of the driving element DT by sampling the threshold voltage Vth of the driving element DT using a plurality of switch elements M1 to M6. The driving element DT and the switch elements M1 to M6 may be implemented as p-channel transistors.

The operation of the internal compensation circuit is divided into an initialization period in which the fifth and sixth switch elements M5 and M6 are turned on according to the gate-on voltage VGL of an (N−1)-th scan signal SCAN(N−1) to initialize the pixel circuit, a sampling period in which the first and second switch elements M1 and M2 are turned on according to the gate-on voltage VGL of an N-th scan signal SCAN(N) such that the threshold voltage of the driving element DT is sampled and stored in a capacitor Cst, a data write period in which the first to sixth switch elements M1 to M6 remain in an off state, and an emission period in which the third and fourth switch elements M3 and M4 are turned on such that the light-emitting element LEL emits light. In the emission period, to accurately represent the luminance of a low gray scale with a duty ratio of the emission signal EM(N), the emission signal EM(N) swings between the gate-on voltage VGL and the gate-off voltage VGH at a predetermined duty ratio such that the third and fourth switch elements M3 and M4 can be repeatedly turned on/off.

The light-emitting element LEL may be implemented as an organic light-emitting diode or an inorganic light-emitting diode. An example in which the light-emitting element LEL is implemented as an organic light-emitting diode will be described in the following. The light-emitting element LEL may be implemented as an OLED. The light-emitting element LEL includes an organic compound layer formed between an anode and a cathode. Although the organic compound layer may include a hole injection layer (HIL), a hole transport layer (HTL), an emission layer (EML), an electron transport layer (ETL) and an electron injection layer EIL, the present disclosure is not limited thereto. The anode of the light-emitting element LEL is connected to a fourth node n4 between the fourth and sixth switch elements M4 and M6. The fourth node n4 is connected to a second electrode of the fourth switch element M4 and a second electrode of the sixth switch element M6. The cathode of the light-emitting element LEL is connected to a VSS electrode 106 to which the low power voltage VSS is applied. The light-emitting element LEL emits light with a current Ids flowing according to a gate-source voltage Vgs of the driving element DT. A current path of the light-emitting element LEL is switched by the third and fourth switch elements M3 and M4.

The storage capacitor Cst is connected between a ELVDD line 104 and a second node n2. A data voltage Vdata compensated by the threshold voltage Vth of the driving element DT is charged in the storage capacitor Cst. Since the data voltage Vdata is compensated by the threshold voltage Vth of the driving element DT in each sub-pixel, characteristic variation of the driving element DT is compensated in sub-pixels.

The first switch element M1 is turned on in response to the gate-on voltage VGL of the N-th scan signal SCAN(N) to connect a second node n2 is connected to a third node n3. The second node n2 is connected to the gate of the driving element DT, a first electrode of the storage capacitor Cst and a first electrode of the first switch element M1. The third node n3 is connected to a second electrode of the driving element DT, a second electrode of a first switch element M1 and a first electrode of the fourth switch element M4. The gate of the first switch element M1 is connected to a first gate line 31 to be provided with the N-th scan signal SCAN(N). The first electrode of the first switch element M1 is connected to the second node n2 and a second electrode of the first switch element M1 is connected to the third node n3.

The second switch element M2 is turned on in response to the gate-on voltage VGL of the N-th scan signal SCAN(N) to provide the data voltage Vdata to the first node n1. The gate of the second switch element M2 is connected to the first gate line 31 to be provided with the N-th scan signal SCAN(N). A first electrode of the second switch element M2 is connected to the first node n1. A second electrode of the second switch element M2 is connected to a data line 102 to which the data voltage Vdata is applied. The first node n1 is connected to the first electrode of the second switch element M2, a second electrode of the third switch element M3 and the first electrode of the driving element DT.

The third switch element M3 is turned on in response to the gate-on voltage VGL of the emission signal EM(N) to connect the VDD line 104 to the first node n1. The gate of the third switch element M3 is connected to a third gate line 33 to be provided with the emission signal EM(N). A first electrode of the third switch element M3 is connected to the VDD line 104. The second electrode of the third switch element M3 is connected to the first node n1.

The fourth switch element M4 is turned on in response to the gate-on voltage VGL of the emission signal EM(N) to connect the third node n3 to the anode of the light-emitting element LEL. The gate of the fourth switch element M4 is connected to the third gate line 33 to be provided with the emission signal EM(N). The first electrode of the fourth switch element M4 is connected to the third node n3 and the second electrode thereof is connected to the fourth node n4.

The emission signal EM(N) switches the current path of the light-emitting element LEL by controlling turn-on/turn-off of the third and fourth switch elements M3 and M4 to control turn-on/turn-off time of the light-emitting element LEL.

The fifth switch element M5 is turned on in response to the gate-on voltage VGL of the (N−1)-th scan signal SCAN(N−1) to connect the second node n2 to a Vini line 105. The gate of the fifth switch element M5 is connected to a second gate line 32 to be provided with the (N−1)-th scan signal SCAN(N−1). A first electrode of the fifth switch element M5 is connected to the second node n2 and a second electrode thereof is connected to the Vini line 105.

The sixth switch element M6 is turned on in response to the gate-on voltage VGL of the (N−1)-th scan signal SCAN(N−1) to connect the Vini line 105 to the fourth node n4. The gate of the sixth switch element M6 is connected to the second gate line 32 to be provided with the (N−1)-th scan signal SCAN(N−1). A first electrode of the sixth switch element M6 is connected to the Vini line 105 and the second electrode thereof is connected to the fourth node n4.

The driving element DT drives the light-emitting element LEL by controlling current Ids flowing through the light-emitting element LEL according to the gate-source voltage Vgs. The driving element DT includes the gate connected to the second node n2, the first electrode connected to the first node n1 and the second electrode connected to the third node n3.

The (N−1)-th scan signal SCAN(N−1) is generated as the gate-on voltage VGL during the initialization period Tini. The N-th scan signal SCAN(N) and the emission signal EM(N) maintain the gate-off voltage VGH during the initialization period Tini. Accordingly, the fifth and sixth switch elements M5 and M6 are turned on during the initialization period Tini and thus the second and fourth nodes n2 and n4 are initialized to Vini. A hold period Th may be set between the initialization period Tini and the sampling period Tsam. The gate signals SCAN(N−1), SCAN(N) and EM(N) maintain previous states in the hold period Th.

The N-th scan signal SCAN(N) is generated as the gate-on voltage VGL during the sampling period Tsam. A pulse of the N-th scan signal SCAN(N) is synchronized with a data voltage Vdata of an N-th pixel line. The (N−1)-th scan signal SCAN(N−1) and the emission signal EM(N) maintain the gate-off voltage VGH during the sampling period Tsam. Accordingly, the first and second switch elements M1 and M2 are turned on.

A gate voltage DTG of the driving element DT rises according to the current flowing through the first and second switch elements M1 and M2 during the sampling period Tsam. When the driving element DT is turned off, the gate voltage DTG is Vdata−|Vth|. Here, the voltage of the first node n1 is also Vdata−|Vth|. The gate-source voltage Vgs of the driving element DT is |Vgs|=Vdata−(Vdata−|Vth|)=|Vth| in the sampling period Tsam.

During the data write period Twr, the N-th scan signal SCAN(N) is inverted to the gate-off voltage VGH. The (N−1)-th scan signal SCAN(N−1) and the emission signal EM(N) maintain the gate-off voltage VGH during the data write period Twr. Accordingly, all the switch elements M1 to M6 maintain a turn-off state during the data write period Twr.

During the emission period Tem, the emission signal EM(N) is on/off at a predetermined duty ratio to swing between the gate-on voltage VGL and the gate-off voltage VGH. The (N−1)-th scan signal SCAN(N−1) and the N-th scan signal SCAN(N) maintain the gate-off voltage VGH during the emission period Tem. The third and fourth switch elements M3 and M4 are repeatedly turned on/off according to the voltage of the emission signal EM during the emission period Tem. When the emission signal EM(N) corresponds to the gate-on voltage VGL, the third and fourth switch elements M3 and M4 are turned on and thus current flows through the light-emitting element LEL. Here, Vgs of the driving element DT is |Vgs|=ELVDD−(Vdata−|Vth|) and the current flowing through the light-emitting element LEL is K(VDD−Vdata)2. K is a proportional constant determined by charge mobility, parasitic capacitance and channel capacity of the driving element DT.

In the foldable display of the present disclosure, the flexible display panel 100 includes the first screen L, the second screen R, and the folding boundary region EX which is positioned between the first screen L and the second screen R and is foldable. The first drive IC 300L is connected to data lines of the first screen L and connected to data lines of the first boundary region of the folding boundary region EX which neighbors the first screen L to drive pixels of the first screen L and pixels of the first boundary region. The second drive IC 300R is connected to data lines of the second screen R and connected to data lines of the second boundary region of the folding boundary region EX which neighbors the second screen R to drive pixels of the second screen R and the second boundary region.

When only the first screen L is driven, only channels connected to the data lines of the first screen L in the first drive IC 300L are driven. Here, channels connected to the data lines of the first boundary region in the first drive IC 300L are shut down and all channels of the second drive IC 300R are shut down. In other words, the second drive IC 300R may be shut down.

When only the second screen R is driven, only channels connected to the data lines of the second screen R in the second drive IC 300R are driven. Here, channels connected to the data lines of the second boundary region in the second drive IC 300R are shut down and all channels of the first drive IC 300L are shut down. In other words, the first drive IC 300L may be shut down.

When both the first and second screens L and R are driven, channels connected to the data lines of the first screen L and the first boundary region in the first drive IC 300L are driven. Channels connected to the data lines of the second screen R and the second boundary region in the second drive IC 300R are driven.

The host system 200 controls shutdown of the first and second drive ICs 300L and 300R and shutdown of the channels of the first and second drive ICs 300L and 300R according to whether the first and second screens L and R are driven.

The host system 200 provides an enable signal EN to the first and second drive ICs 300L and 300R to control the screen of the foldable display as shown in the following table 1. The host system 200 may be connected to various sensors which sense the posture or a folding degree of the flexible display panel and screen opening/shutting to determine whether the screen is open or shut and/or whether a screen among the first and second screens L and R is viewed by a user on the basis of signals from the sensors. Accordingly, the host system 200 can control the screen of the foldable display as follows by determining whether the screen is open or shut and/or whether a screen is viewed by the user. In other words, the host system 200 may be configured to control driving of the first and second screens L and R. The host system 200 may generate an enable signal described below according to a user input or command irrespective of whether the screen is open or shut to control the screens L and R. The host system 200 transmits the enable signal EN to the drive ICs 300L and 300R through an MIPI and the drive ICs 300L and 300R operate as shown in the table 1 below in response to the enable signal EN. Table 1 may be stored in the second memory 132 as register setting data.

| Right EN | Left EN | Dual EN | Division | | Left D-IC | Right D-IC |
|---|---|---|---|---|---|---|
| 0 | 0 | 0 | Source AMP. ERA | Active Extra Left Right | Shutdown | Shutdown |
| 0 | 1 | 0 | Source AMP. ERA | Active Extra Left Right | ON OFF ON ON | Shutdown |
| 1 | 0 | 0 | Source AMP. ERA | Active Extra Left Right | Shutdown | ON OFF ON ON |
| 1 | 1 | 1 | Source AMP. ERA | Active Extra Left Right | ON ON ON OFF | ON ON OFF ON |

As can be ascertained from Table 1, the enable signal EN can be generated as a 3-bit signal with 1 bit for Right EN, 1 bit for Left EN and 1 bit for Dual EN. The left EN bit indicates whether the first screen L is driven. The first drive IC 300L drives the first screen L when Left EN=1. The right EN bit indicates whether the second screen R is driven. The second drive IC 300R drives the second screen R when Right EN=1.

The first drive IC 300L is shut down when Left EN=0 and the second drive IC 300R is shut down when Right EN=0, and thus current consumed by the drive ICs can be reduced. Shutdown of the drive ICs includes a method of shutting down the entire drive ICs and a method of shutting down some circuits such as the data driver 110 and the level shifter 134 in the drive ICs such that the drive ICs can rapidly wake up during restarting.

Dual EN bit indicates whether the first and second screens L and R are simultaneously driven. When Dual EN bit=1, the first and second drive ICs 300L and 300R drive the first and second screens L and R. When Dual EN bit=0, at least one of the first and second drive ICs 300L and 300R is shut down. When Right EN=0, Left EN=0 and Dual EN=0, both the first and second drive ICs 300L and 300R are shut down.

In Table 1, Source AMP is an output buffer of the drive ICs 300L and 300R. The output buffer (Source AMP) is divided into an active channel buffer and an extra channel buffer. In Table 1, Active represents an active channel buffer connected to data channels of the drive ICs 300L and 300R which are connected to the data lines of the first and second screens L and R other than the folding boundary region EX.

Figure 9:
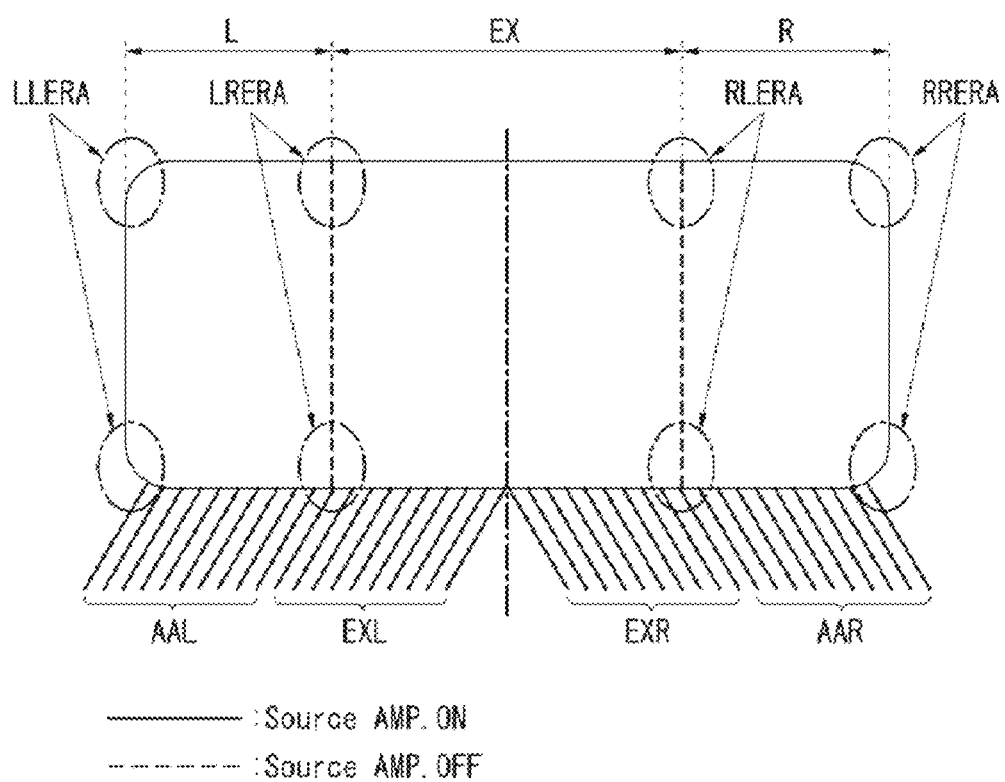

In Table 1, ERA (Edge Round Algorithm) is a data processing option for rounding pixels at each corner of the screens L and R, as shown in FIG. 9. In FIG. 9, LLERA represents left corner pixel regions of the first screen L and LRERA represents right corner pixel regions of the first screen L. The right corner pixel regions LRERA of the first screen L neighbor the first boundary region of the folding boundary region EX. In FIG. 9, RLERA represents left corner pixel regions of the second screen R and RRERA represents right corner pixel regions of the second screen R. The left corner pixel regions RLERA of the second screen R neighbor the second boundary region of the folding boundary region EX.

As can be ascertained from Table 1, the present disclosure can reduce power consumption without affecting screen operation by selectively shutting down output buffers of the drive ICs 300L and 300R.

Figure 7:
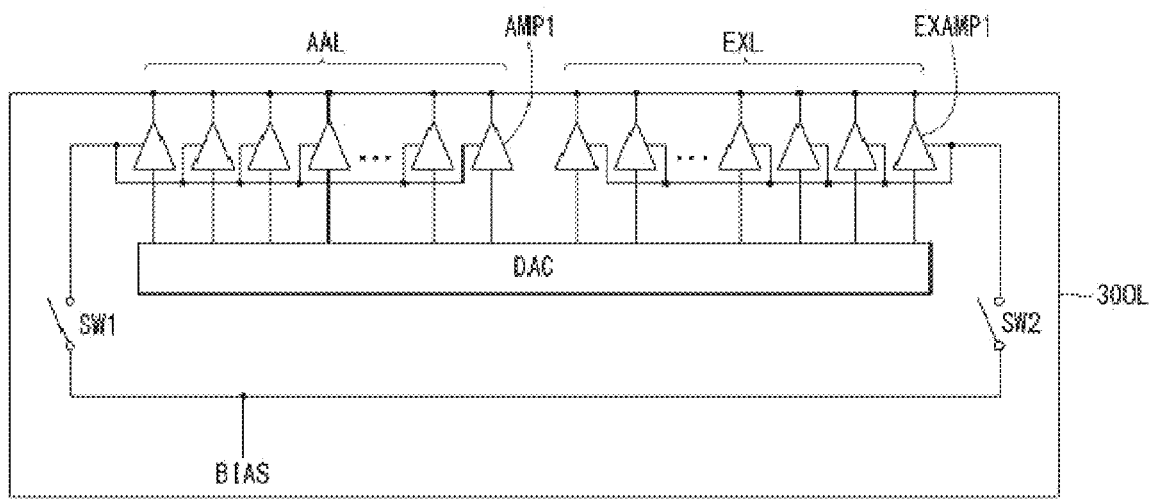
FIG. 7 is a diagram showing a method of selectively shutting down output buffers of drive ICs.
Figure 7:
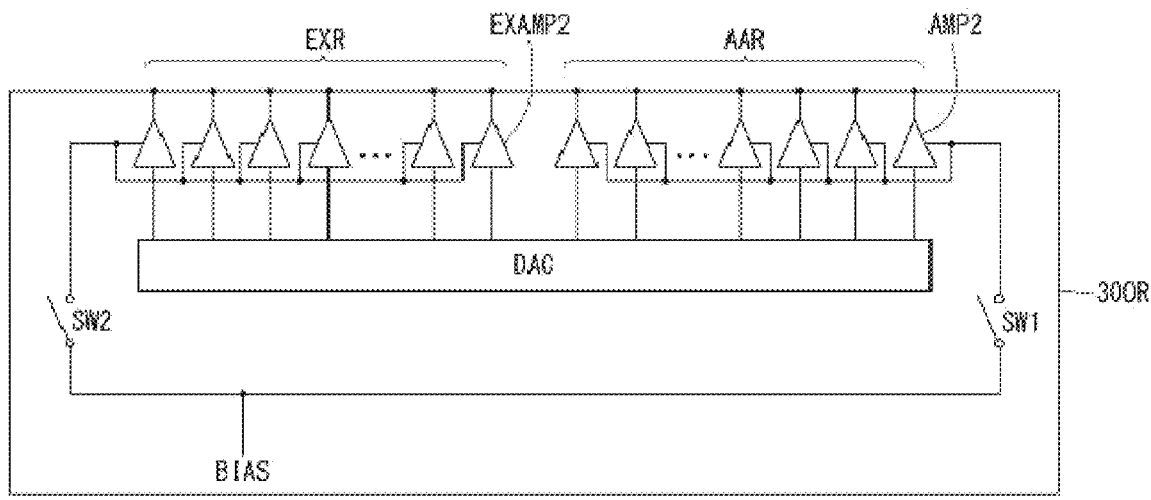

FIG. 7 is a diagram showing a method of selectively shutting down the output buffers (Source AMP) of the drive ICs 300L and 300R. In FIG. 7, AAL represents first active channels connected to the data lines of the first screen L in the first drive IC 300L. EXL represents first extra channels connected to the data lines of the first boundary region in the first drive IC 300L. AMP1 represents output buffers of the first drive IC 300L which are connected to the first active channels. EXAMP1 represents output buffers of the first drive IC 300L which are connected to the first extra channels.

AAR represents second active channels connected to the data lines of the second screen R in the second drive IC 300R. EXR represents second extra channels connected to the data lines of the second boundary region in the second drive IC 300R. AMP2 represents output buffers of the second drive IC 300R which are connected to the second active channels. EXAMP2 represents output buffers of the second drive IC 300R which are connected to the second extra channels.

Referring to FIG. 7, the drive ICs 300L and 300R include switch elements SW1 and SW2 which switch transmission paths of a bias control signal BIAS for controlling the output buffers AMP1, AMP2, EXAMP1 and EXAMP2.

The bias control signal BIAS and control signals of the switch elements SW1 and SW2 may be generated from the host system 200. The bias control signal BIAS controls on/off of the output buffers AMP1, AMP2, EXAMP1 and EXAMP2 and controls the quantity of current. When the bias control signal BIAS is not applied to the output buffers AMP1, AMP2, EXAMP1 and EXAMP2, the output buffers AMP1, AMP2, EXAMP1 and EXAMP2 are shut down and thus do not operate. Accordingly, current consumption does not occur. The first switch element SW1 selectively blocks a transmission path between the output buffers AMP1 and AMP2 connected to the active channels and the bias control signal BIAS under the control of the host system 200. The second switch element SW2 selectively blocks a transmission path between the output buffers EXAMP1 and EXAMP2 connected to the extra channels and the bias control signal BIAS under the control of the host system 200.

Hereinafter, operations of the first and second drive ICs 300L and 300R will be described with reference to FIGS. 8 to 14.

FIGS. 8 to 16 are diagrams showing the operation of the foldable display, and specifically showing the operations of the first and second drive ICs 300L and 300R. FIGS. 8 to 16 further show a driving method of the foldable display.

Figure 8:
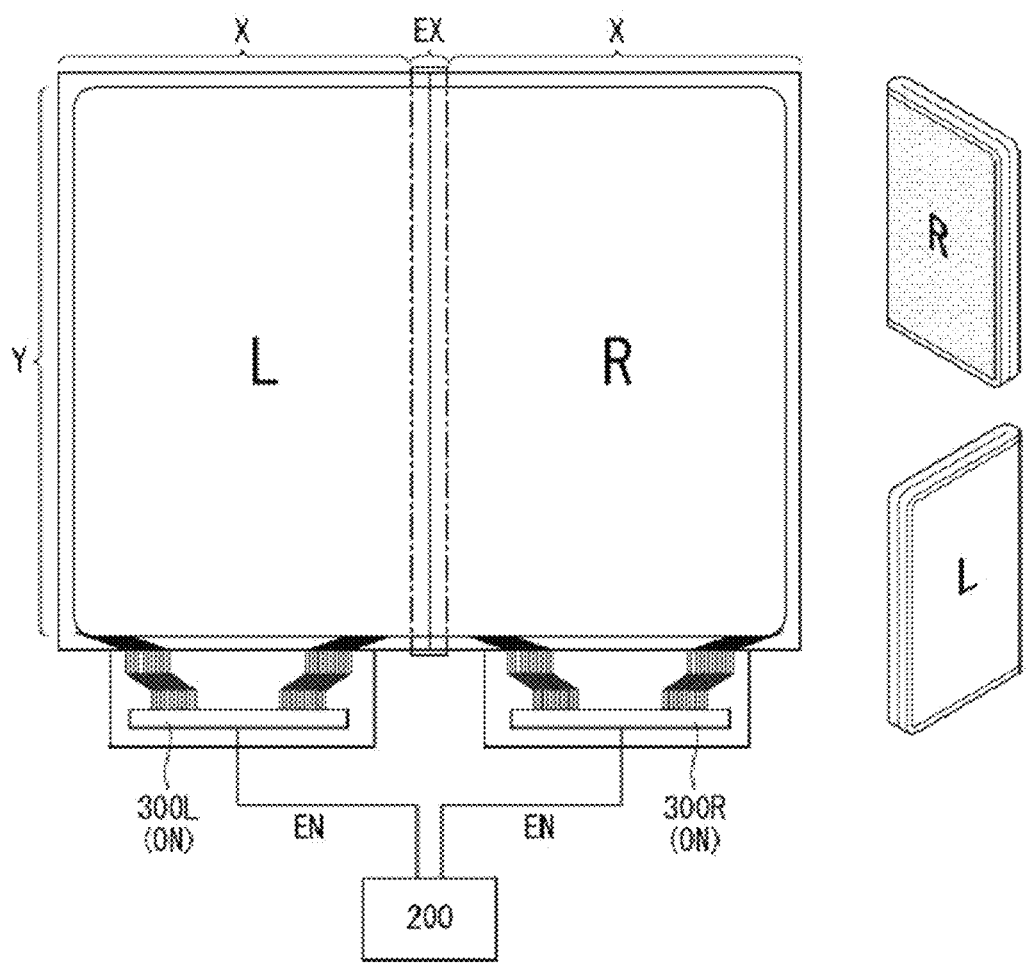
FIGS. 8 to 16 are diagrams showing operations of first and second drive ICs.

Referring to FIGS. 8 and 9, the first and second drive ICs 300L and 300R simultaneously operate to drive the first and second screens L and R. The host system 200 generates the enable signal EN as 111 in Table 1 to enable both the first and second drive ICs 300L and 300R.

If the first and second screens L and R are unfolded, the screen of the folding boundary region EX between the first and second screens L and R is also driven. The first drive IC 300L provides a data voltage Vdata to the data lines of the first screen L and the first boundary region by driving the output buffers AMP1 connected to the first active channels AAL and the output buffers EXAMP1 connected to the first extra channels EXL (ON). The second drive IC 300R provides the data voltage Vdata to the data lines of the second screen R and the second boundary region by driving the output buffers AMP2 connected to the second active channels AAR and the output buffers EXAMP2 connected to the second extra channels EXR (ON).

Figure 14:
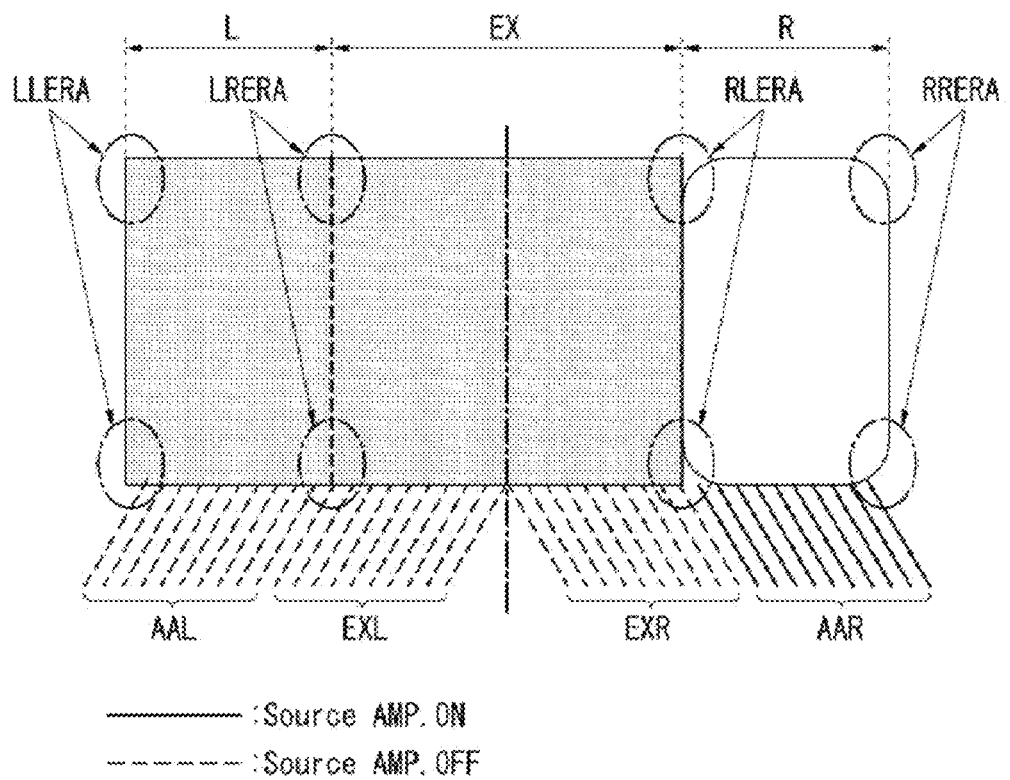

When the first and second screens L and R are simultaneously driven, the left corner pixel regions LLERA of the first screen L and the right corner pixel regions RRERA of the second screen R are rounded by the ERA. The ERA changes gray scales of pixel data to be written to pixels disposed outside curved boundary lines of the above-mentioned corner pixel regions LLERA and RRERA to black gray scale, as shown in FIG. 14. When the ERA is executed, black gray-scale data irrelevant to an input image is written to pixels disposed outside predetermined curved boundary lines.

When the first and second screens L and R are simultaneously driven, the pixel data of the input image is displayed on the pixels of the right corner pixel regions LRERA of the first screen L and the left corner pixel regions RLERA of the second screen R such that the image reproduced between the first and second screens L and R is not cut off.

Figure 10:
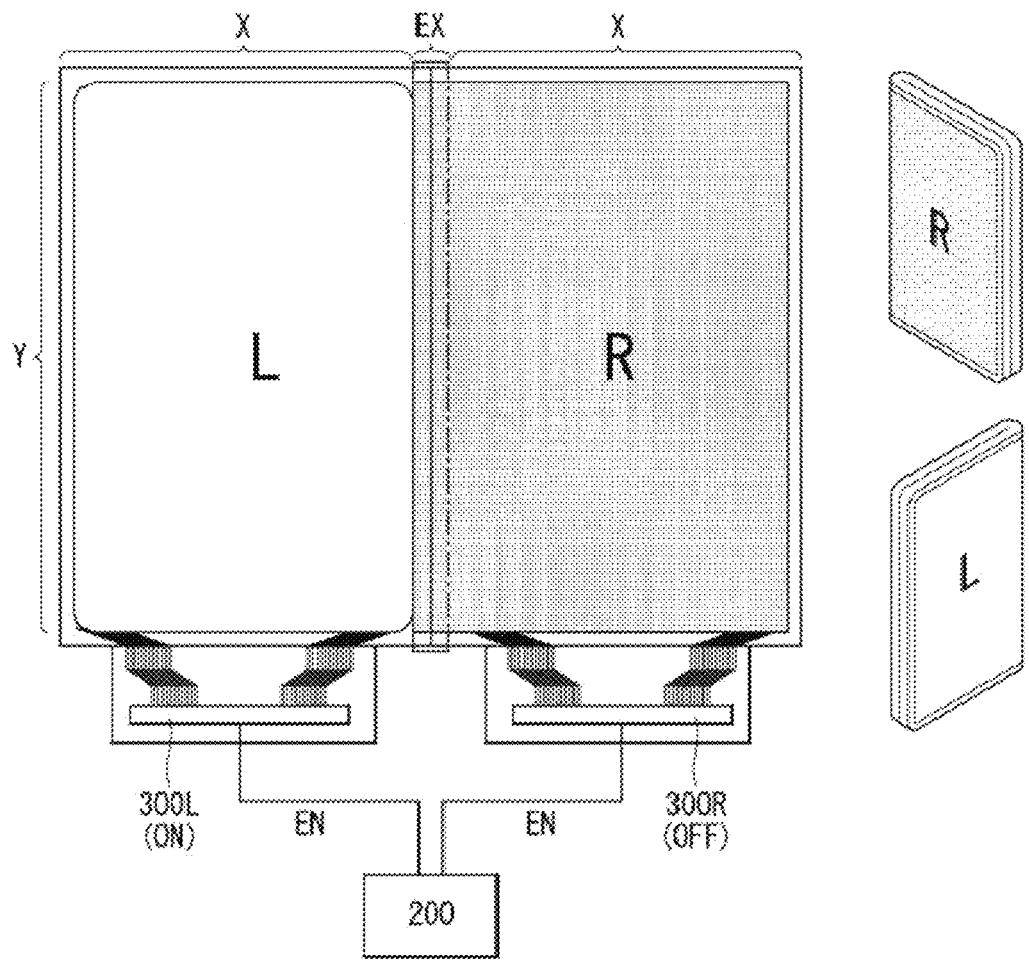
Figure 11:
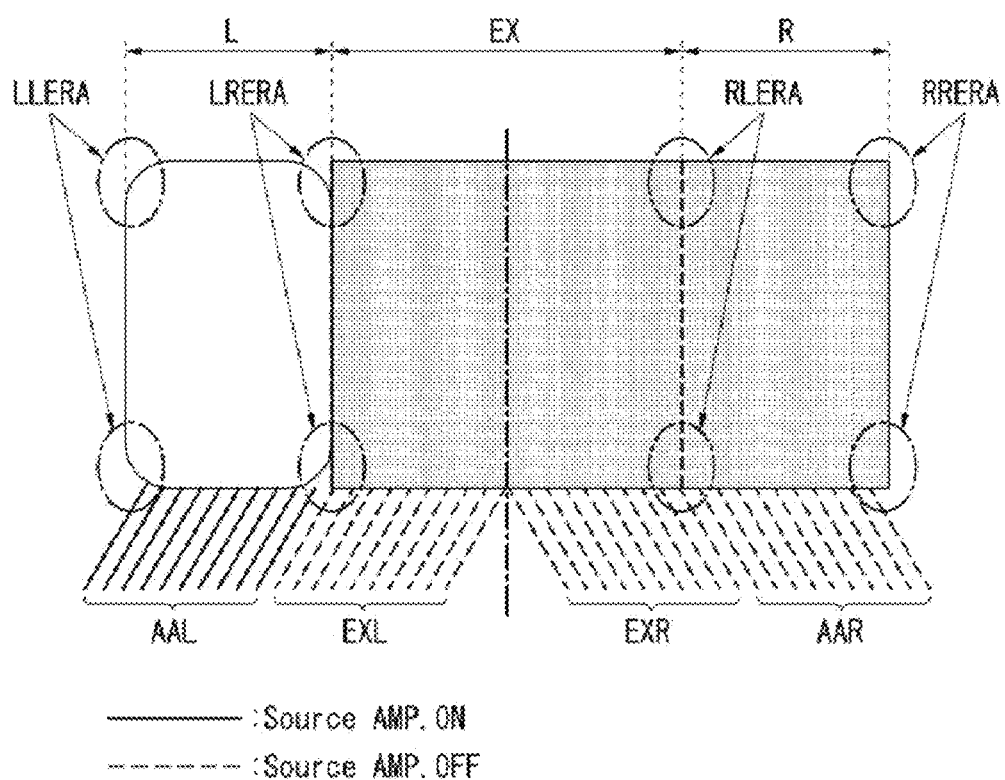

Referring to FIGS. 10 and 11, only the first drive IC 300L between the first and second drive ICs 300L and 300R operates to drive the first screen L. The host system 200 generates the enable signal EN as 010 in Table 1 to drive only the first drive IC 300L and shut down the second drive IC 300R. Accordingly, the second drive IC 300R does not output a data voltage and a gate control signal because it is shut down, and thus current consumption does not occur.

When the enable signal EN is generated as 010, the first screen L is driven to reproduce an input image, whereas the folding boundary region EX and the second screen R are not driven, as can be ascertained from Table 1. The first drive IC 300L provides the data voltage Vdata to the data lines of the first screen L by driving the output buffers AMP1 connected to the first active channels AAL. In the first drive IC 300L, the output buffers EXAMP1 connected to the first extra channels EXL are shut down. The output buffers AMP2 and EXAMP2 connected to the second active channel AAR and the second extra channel EXR of the second drive IC 300R are shut down and thus do not output the data voltage Vdata.

Figure 15:
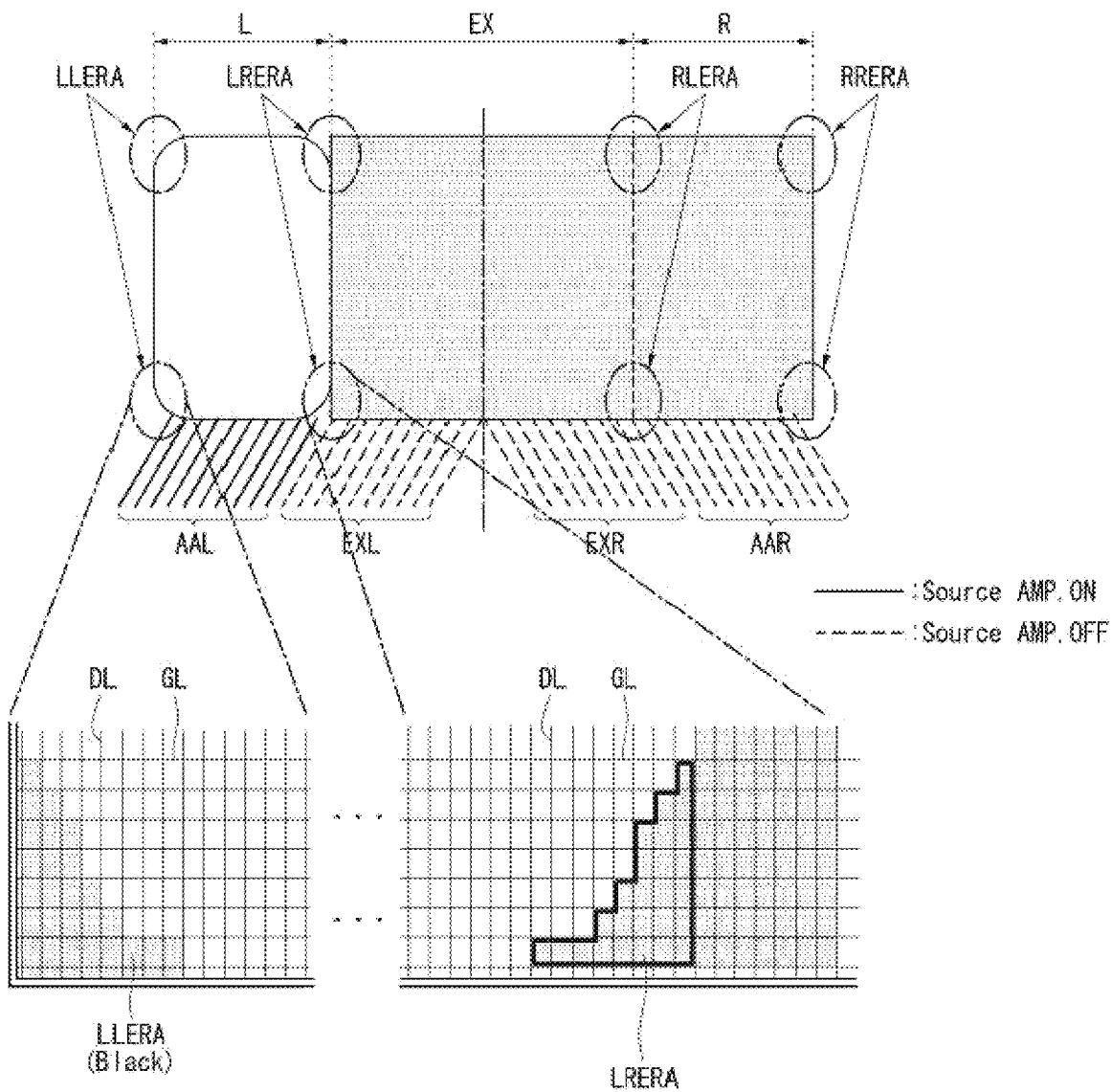

When only the first screen L is driven, the left corner pixel regions LLERA and the right corner pixel regions LRERA of the first screen L can be rounded through the ERA such that the first screen L can become bilaterally symmetrical. The ERA changes gray scales of pixel data to be written to pixels disposed outside the curved boundary lines of the respective corner pixel regions of the first screen L to black gray scale, as shown in FIG. 15. When the ERA is executed, black gray-scale data irrelevant to an input image is written to pixels disposed outside predetermined curved boundary lines.

Figure 12:
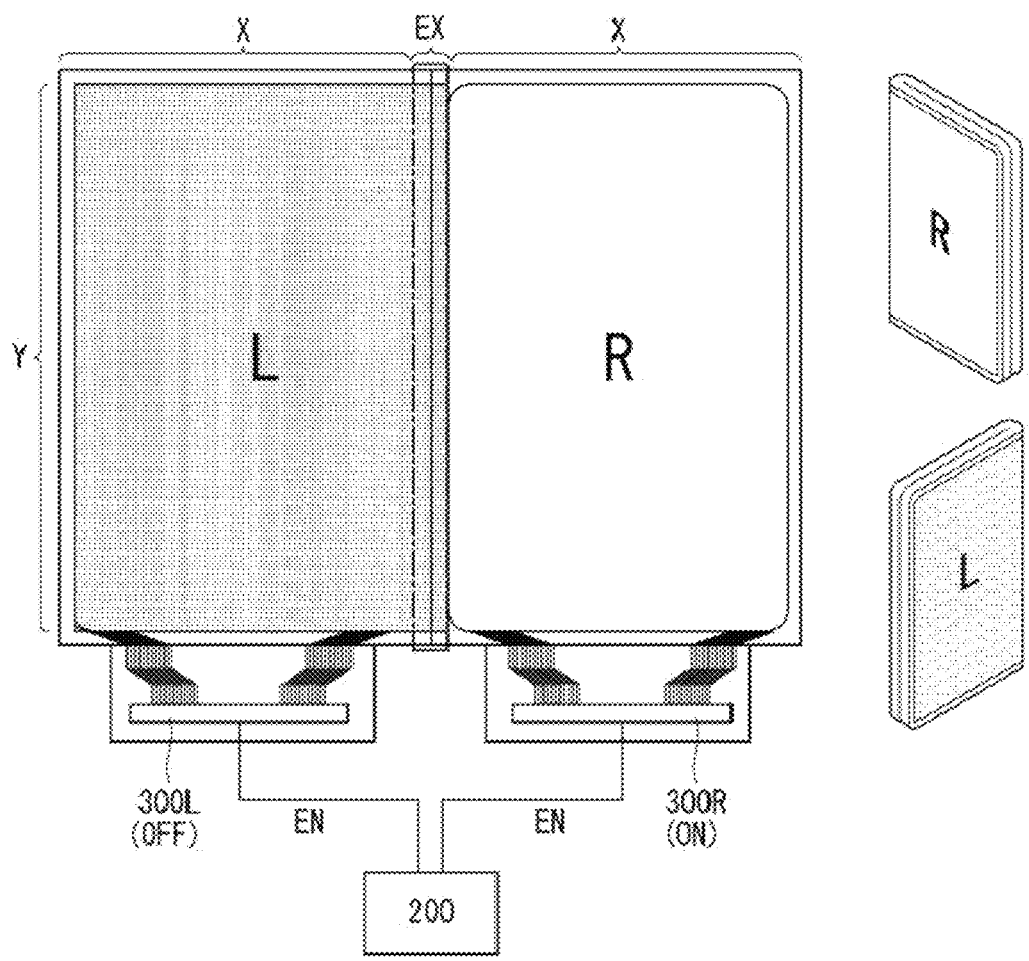
Figure 13:
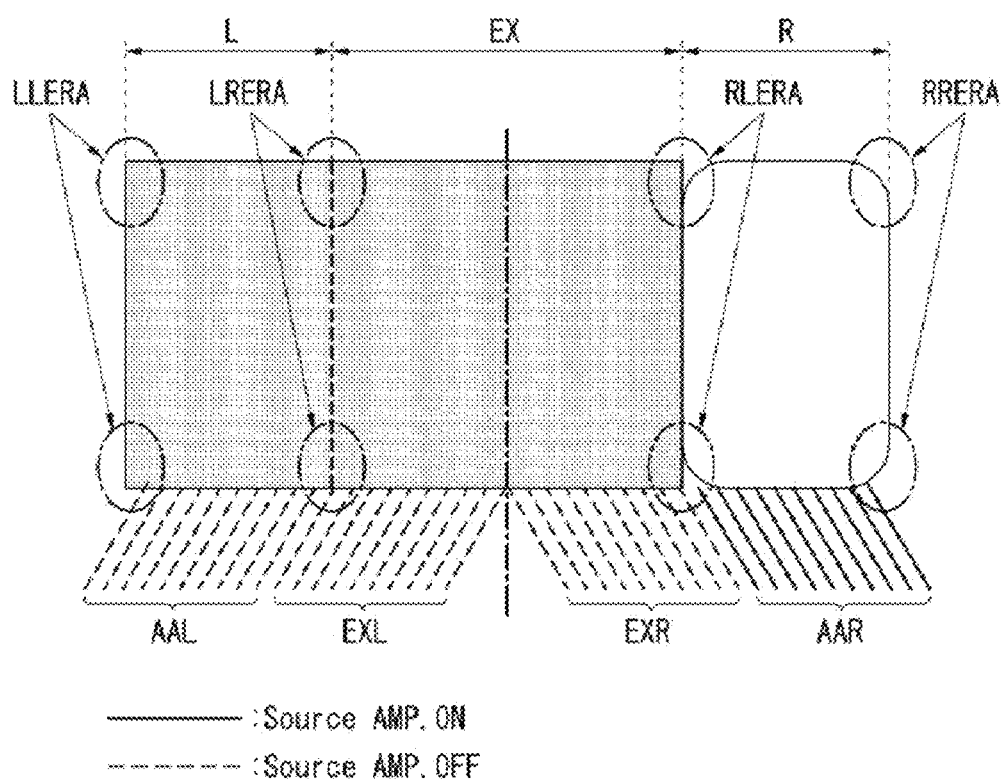

Referring to FIGS. 12 and 13, only the second drive IC 300R between the first and second drive ICs 300L and 300R operates to drive the second screen R. The host system 200 generates the enable signal EN as 100 in Table 1 to drive only the second drive IC 300R and shut down the first drive IC 300L. Accordingly, the first drive IC 300L does not output a data voltage and a gate control signal because it is shut down, and thus current consumption does not occur.

When the enable signal EN is generated as 100, the second screen R is driven to reproduce an input image, whereas the folding boundary region EX and the first screen L are not driven, as can be ascertained from Table 1. The second drive IC 300R provides the data voltage Vdata to the data lines of the second screen R by driving the output buffers AMP2 connected to the second active channels AAR. In the second drive IC 300R, the output buffers EXAMP2 connected to the second extra channels EXR are shut down. The output buffers AMP1 and EXAMP1 connected to the first active channel AAL and the first extra channel EXL of the first drive IC 300L are shut down and thus do not output the data voltage Vdata.

Figure 16:
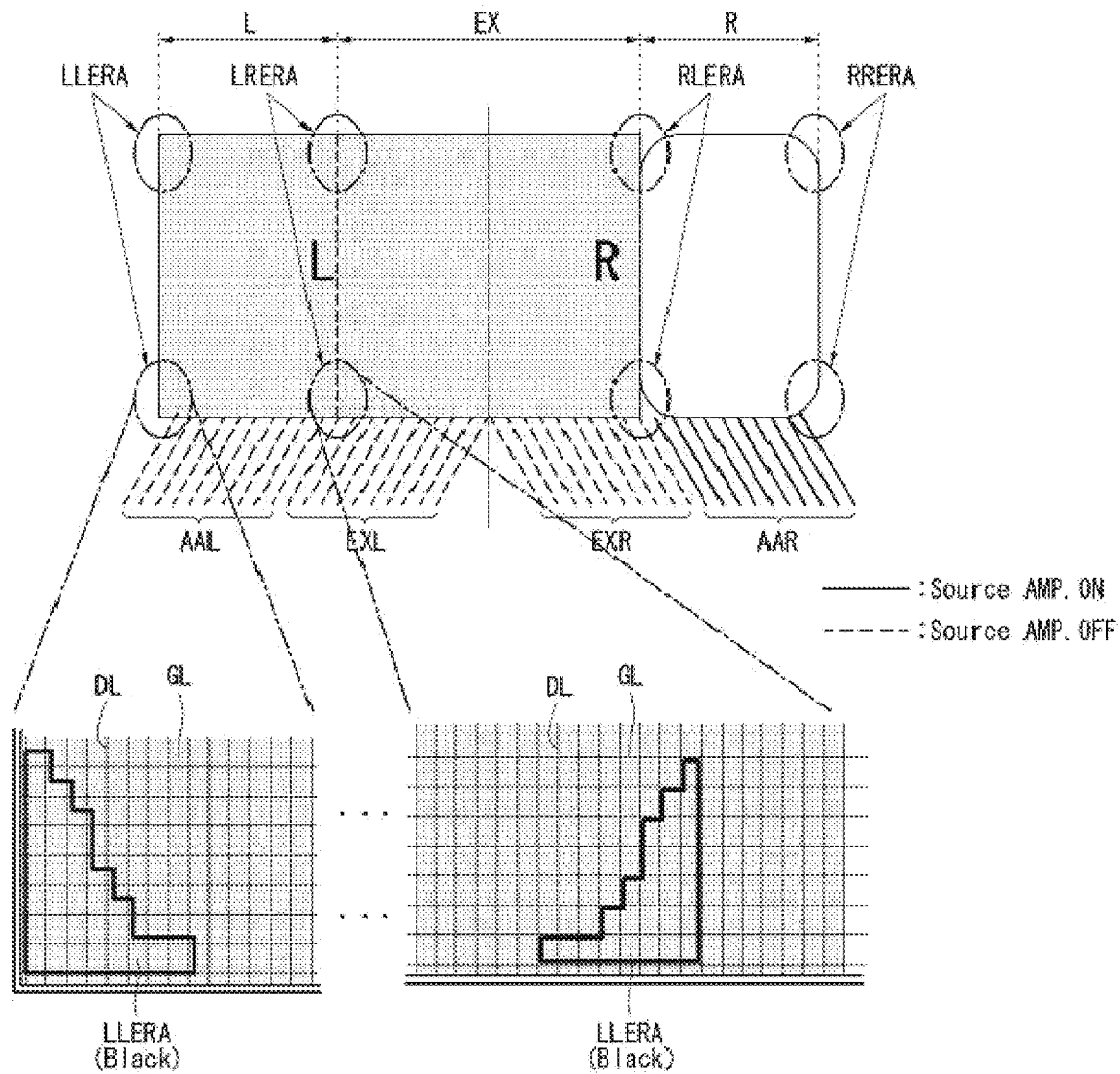

When only the second screen R is driven, the left corner pixel regions RLERA and the right corner pixel regions RRERA of the second screen R can be rounded through the ERA such that the second screen R can become bilaterally symmetrical. The ERA changes gray scales of pixel data to be written to pixels disposed outside the curved boundary lines of the respective corner pixel regions of the second screen R to black gray scale, as shown in FIG. 16. When the ERA is executed, black gray-scale data irrelevant to an input image is written to pixels disposed outside predetermined curved boundary lines.

Figure 17:
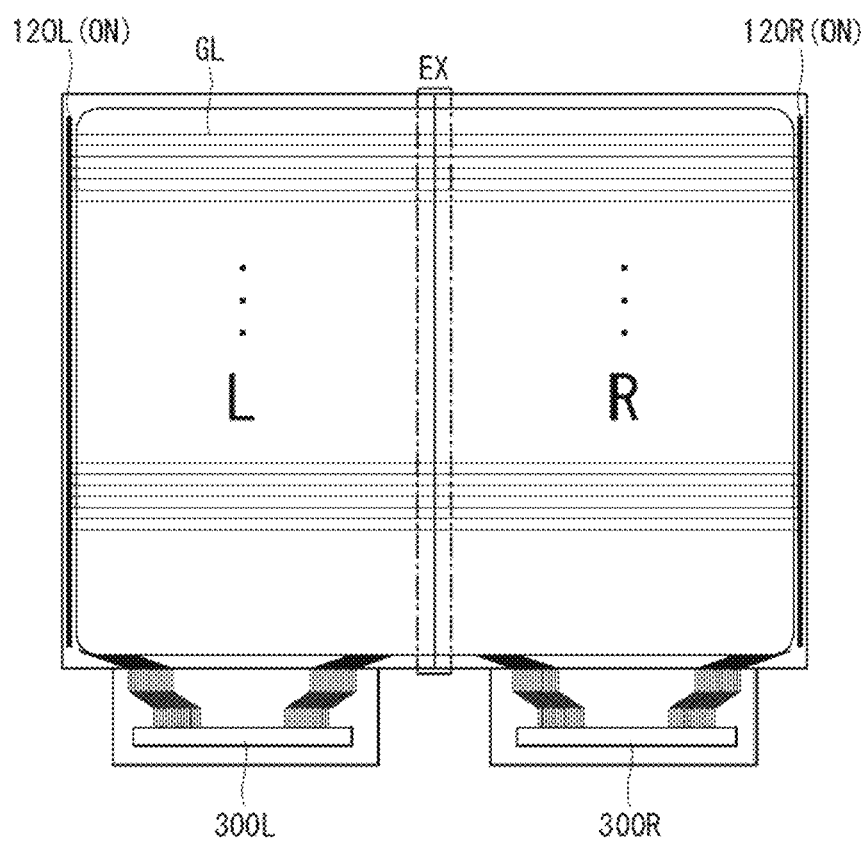
FIGS. 17 to 19 are diagrams showing operation of a gate driver.
Figure 18:
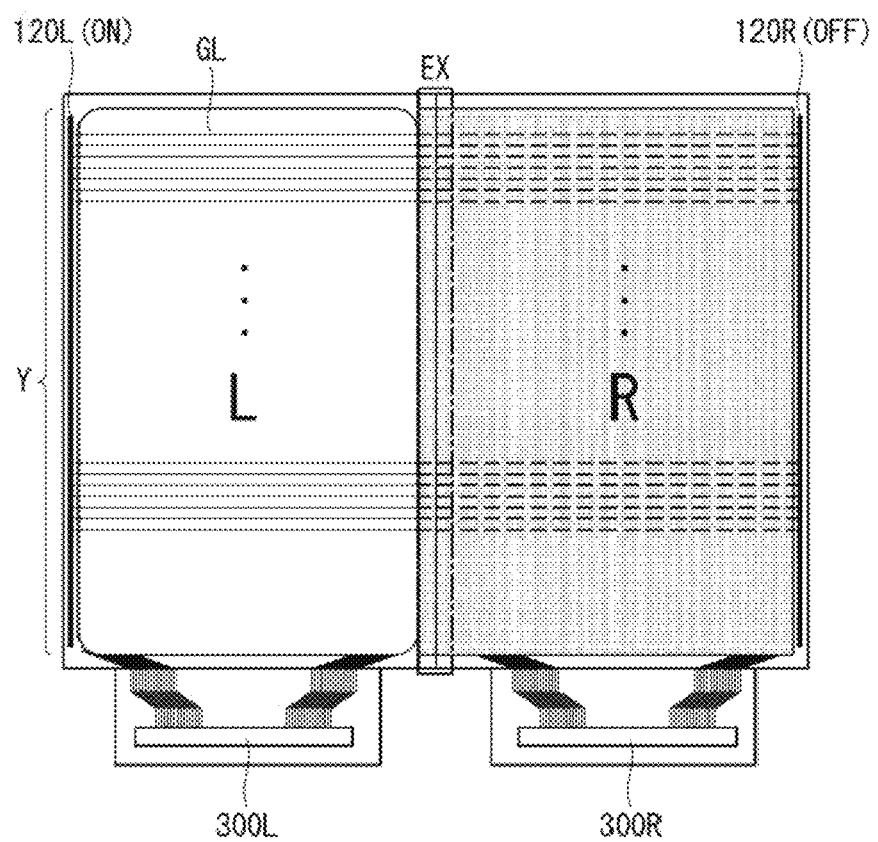
Figure 19:
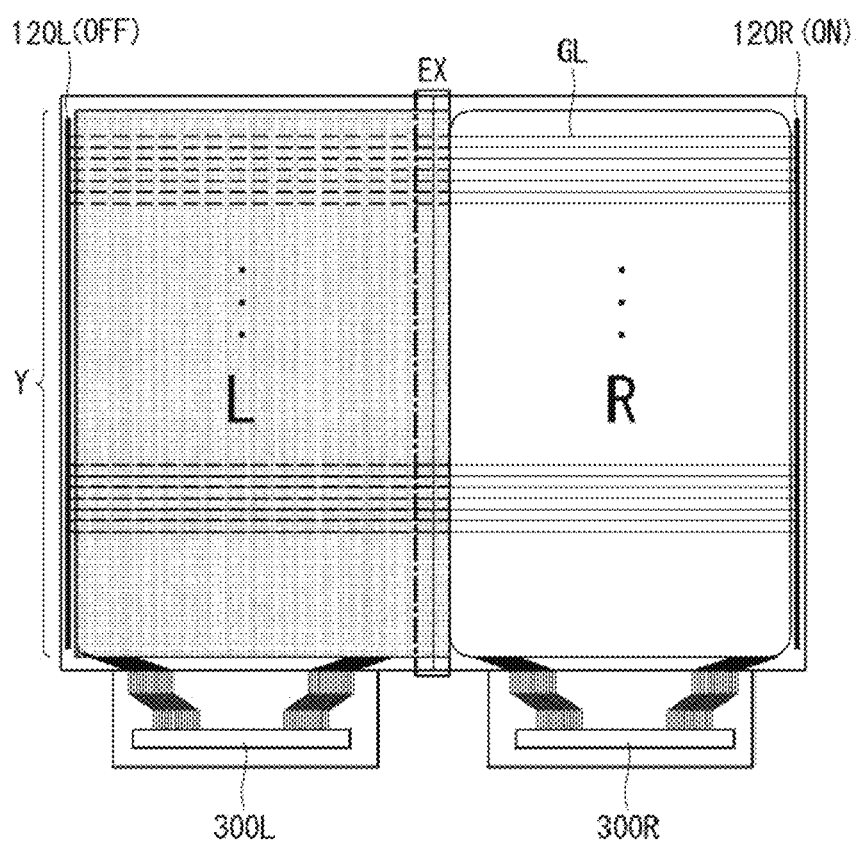

FIGS. 17 to 19 are diagrams showing the operation of the gate driver.

Referring to FIG. 17, the first and second drive ICs 300L and 300R simultaneously operate to drive the first and second screens L and R. The host system 200 generates the enable signal EN as 111 in Table 1 to enable both the first and second drive ICs 300L and 300R. Here, the first drive IC 300L provides the gate control signal to the first gate driver 120L and the second drive IC 300R provides the gate control signal to the second gate driver 120R. Accordingly, a gate signal is simultaneously applied to both ends of each of the gate lines GL1 and GL2. Accordingly, a gate signal is simultaneously applied to both ends of one gate line. The gate signal is shifted by shift registers connected to both sides of the gate lines GL1 and GL2.

Referring to FIG. 18, only the first drive IC 300L between the first and second drive ICs 300L and 300R operates to drive the first screen L. The host system 200 generates the enable signal EN as 010 in Table 1 to drive only the first drive IC 300L and shut down the second drive IC 300R. Here, the first drive IC 300L provides the gate control signal to the first gate driver 120L. Accordingly, the first gate driver 120L applies a gate signal to the gate lines GL1 and GL2 through a single feeding method. A shift register of the first gate driver 120L shifts the gate signal applied to the gate lines GL1 and GL2.

When only the first screen L is driven, the second drive IC 300R is shut down and thus does not output a data voltage and the gate control signal. Accordingly, current consumption does not occur. Accordingly, the second gate driver 120R is also shut down because the second drive IC 300R is shut down, and thus current consumption does not occur in the second gate driver 120R.

Referring to FIG. 19, only the second drive IC 300R between the first and second drive ICs 300L and 300R operates to drive the second screen R. The host system 200 generates the enable signal EN as 100 in Table 1 to drive only the second drive IC 300R and shut down the first drive IC 300L. Here, the second drive IC 300R provides the gate control signal to the second gate driver 120R. Accordingly, the second gate driver 120R applies a gate signal to the gate lines GL1 and GL2 through a single feeding method. A shift register of the second gate driver 120R shifts the gate signal applied to the gate lines GL1 and GL2.

When only the second screen R is driven, the first drive IC 300L is shut down and thus does not output a data voltage and the gate control signal. Accordingly, current consumption does not occur. Accordingly, the first gate driver 120L is also shut down because the first drive IC 300L is shut down, and thus current consumption does not occur in the first gate driver 120L.

Figure 20:
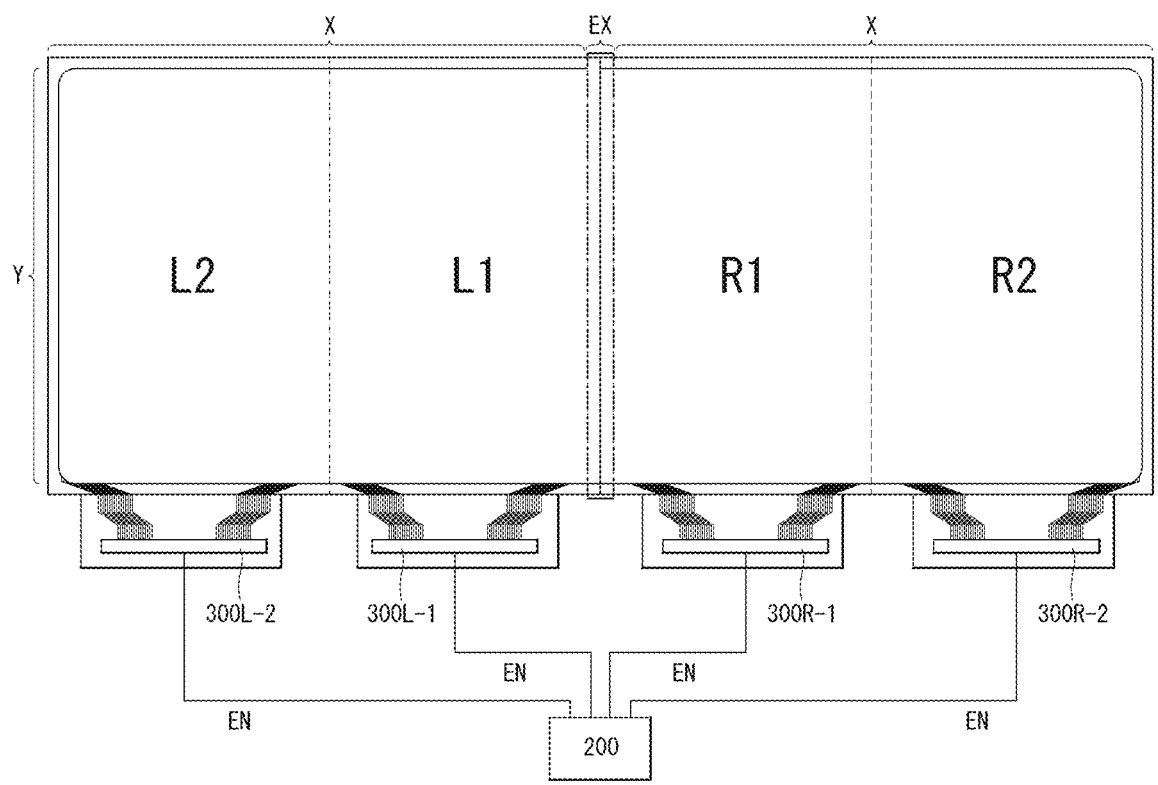
FIG. 20 is a diagram showing a foldable display according to another aspect of the present disclosure.

In a foldable display according to another aspect of the present disclosure, at least one of the first and second screens L and R may be driven by two or more drive ICs, as shown in FIG. 20.

Referring to FIG. 20, the screen of the flexible display panel 100 includes first and second screens folded with respect to the folding boundary region EX.

The first screen includes a (1-1)-th screen L1 close to the folding boundary region EX and a (1-2)-th screen L2 separated from the folding boundary region EX having the (1-1)-th screen L1 disposed therebetween. The second screen includes a (2-1)-th screen R1 close to the folding boundary region EX and a (2-2)-th screen R2 separated from the folding boundary region EX having the (2-1)-th screen R1 disposed therebetween.

A (1-1)-th drive IC 300L-1 is connected to some of first active channels AAL and first extra channels EXL to drive pixels of the (1-1)-th screen L1 and left-half pixels of the folding boundary region EX. A (1-2)-th drive IC 300L-2 is connected to the remaining channels of the first active channels AAL to drive pixels of the (1-2)-th screen L2.

A (2-1)-th drive IC 300R-1 is connected to some of second active channels AAR and second extra channels EXR to drive pixels of the (2-1)-th screen R1 and right-half pixels of the folding boundary region EX. A (2-2)-th drive IC 300R-2 is connected to the remaining channels of the second active channels AAR to drive pixels of the (2-2)-th screen R2.

This aspect can also minimize power consumption without affecting screen operation through substantially the same method as the above-described aspect.

For example, when only the first screen L between the first and second screens L and R is driven, only channels AAL connected to data lines of the (1-1)-th screen L1 among channels of the (1-1)-th drive IC 300L-1 are driven. Here, channels EXL connected to data lines of the first boundary region among the channels of the (1-1)-th drive IC 300L-1 are shut down and all channels of the (1-2)-th, (2-1)-th and (2-2)-th drive ICs 300L-2, 300R-1 and 300R-2 are shut down.

When only the second screen R between the first and second screens L and R is driven, only channels AAR connected to data lines of the (2-1)-th screen R1 among channels of the (2-1)-th drive IC 300R-1 are driven. Here, channels EXR connected to data lines of the second boundary region among the channels of the (2-1)-th drive IC 300R-1 are shut down and all channels of the (2-2)-th, (1-1)-th and (1-2)-th drive ICs 300R-2, 300L-1 and 300L-2 are shut down.

When both the first and second screens L and R are driven, channels AAL and EXR connected to data lines of the first screen L and the first boundary region are driven in the (1-1)-th and (1-2)-th drive ICs 300L-1 and 300L-2. Here, channels AAR and EXL connected to data lines of the second screen and the second boundary region are driven in the (2-1)-th and (2-2)-th drive ICs 300R-1 and 300R-2.

The host system 200 can individually control shutdown of the drive ICs 300L-1, 300L-2, 300R-1 and 300R-2 and shutdown of channels for each drive IC according to whether the first and second screens L and R are driven.

The present disclosure selectively not only shuts down drive ICs which separately drive screens of a foldable display according to whether the screens are driven but also shuts down channels of drive ICs which are connected to the folding boundary region of the foldable display. Consequently, the present disclosure can reduce power consumption of the foldable display without affecting screen operation because current consumption does not occur in the channels of the drive ICs which are connected to the foldable boundary region and drive ICs which have been shut down.

Furthermore, the present disclosure can reduce power consumption of the gate driver by shutting down the gate driver according to whether the screens are driven.

The foldable display according to various aspects of the disclosure may be described as follows.

The foldable display comprises: a flexible display panel including a first screen, a second screen, and a foldable boundary region positioned between the first screen and the second screen; a first drive IC connected to data lines of the first screen and connected to data lines of a first boundary region neighboring the first screen in the foldable boundary region to drive pixels of the first screen and the first boundary region; and a second drive IC connected to data lines of the second screen and connected to data lines of a second boundary region neighboring the second screen in the boundary region to drive pixels of the second screen and the second boundary region, When only the first screen between the first and second screens is driven, channels connected to the data lines of the first screen are driven in the first drive IC, and channels connected to the first boundary region are shut down in the first drive IC, and all channels of the second drive IC are shut down.

When only the second screen between the first and second screens is driven, channels connected to the data lines of the second screen are driven in the second drive IC, and channels connected to the data lines of the second boundary region are shut down in the second drive IC, and all channels of the first drive IC are shut down.

When both the first and second screens are driven, channels connected to the data lines of the first screen and the first boundary region are driven in the first drive IC, and channels connected to the data lines of the second screen and the second boundary region are driven in the second drive IC.

The foldable display further comprises a host system for controlling shutdown of the first and second drive ICs and shutdown of the channels according to whether the first and second screens are driven.

The host system controls enable and shutdown of each of the first and second drive ICs by transmitting an enable signal to the first and second drive ICs.

The enable signal includes a bit indicating whether the first screen is driven, a bit indicating whether the second screen is driven, and a bit indicating whether the first and second screens are simultaneously driven.

When the first and second screens are simultaneously driven, the first drive IC changes gray scales of pixel data, which is to be written to pixels outside a predetermined curved line in a first left corner pixel region distant from the foldable boundary region between the first left corner pixel region and a first right corner pixel region neighboring the foldable boundary region in the first screen to black gray scale, and the second drive IC changes gray scales of pixel data, which is to be written to pixels outside a predetermined curved line in a second right corner pixel region distant from the foldable boundary region between the second right corner pixel region and a second left corner pixel region neighboring the foldable boundary region in the second screen to black gray scale.

When only the first screen between the first and second screens is driven, the first drive IC changes gray scales of pixel data, which is to be written to pixels outside the predetermined curved lines in the first left corner pixel region and the first right corner pixel region to black gray scale.

When only the second screen between the first and second screens is driven, the second drive IC changes gray scales of pixel data to be written to pixels outside the predetermined curved lines to black gray scale in the second left corner pixel region and the second right corner pixel region.

The foldable display further comprises: a first gate driver for providing a gate signal to gate lines of the first screen in response to a gate control signal from the first drive IC; and a second gate driver for providing a gate signal to gate lines of the second screen in response to a gate control signal from the second drive IC.

When only the first screen between the first and second screens is driven, the first gate driver is driven and the second gate driver is shut down.

When only the second screen between the first and second screens is driven, the second gate driver is driven and the first gate driver is shut down.

When the first and second screens are simultaneously driven, the gate lines of the first screen and the gate lines of the second screen are common gate lines, the first gate driver provides a gate signal at one end of each of the common gate lines, the second gate driver provides the gate signal at the other end of each of the common gate lines, and the gate signal is simultaneously applied to one common gate line from both ends thereof.

The foldable display comprises: a flexible display panel including a first screen, a second screen, and a foldable boundary region positioned between the first screen and the second screen; a first driver for driving pixels of the first screen and pixels of a first boundary region neighboring the first screen in the foldable boundary region; and a second driver for driving pixels of the second screen and pixels of a second boundary region neighboring the second screen in the foldable boundary region.

The first screen includes a (1-1)-th screen close to the boundary region and a (1-2)-th screen separated from the boundary region having the (1-1)-th screen disposed therebetween, The second screen includes a (2-1)-th screen close to the boundary region and a (2-2)-th screen separated from the boundary region having the (2-1)-th screen disposed therebetween, The first driver includes a (1-1)-th drive IC connected to data lines of the (1-1)-th screen and connected to data lines of the first boundary region neighboring the first screen in the foldable boundary region to drive pixels of the (1-1)th screen and the first boundary region, and (1-2)-th drive IC connected to data lines of the (1-2)-th screen to drive pixels of the (1-2)-th screen, and The second driver includes a (2-1)-th drive IC connected to data lines of the (2-1)-th screen and connected to data lines of the second boundary region neighboring the second screen in the foldable boundary region to drive pixels of the (2-1)-th second screen and the second boundary region, and (2-2)-th drive IC connected to data lines of the (2-2)-th screen to drive pixels of the (2-2)-th screen, When only the first screen between the first and second screens is driven, channels connected to the data lines of the (1-1)-th screen among channels of the (1-1)-th drive IC are driven, and channels connected to the data lines of the first boundary region among the channels of the (1-1)-th drive IC are shut down, and all channels of the (1-2)-th, (2-1)-th and (2-2)-th drive ICs are shut down.

When only the second screen between the first and second screens is driven, only channels connected to the data lines of the (2-1)-th screen among channels of the (2-1)-th drive IC are driven, channels connected to the data lines of the second boundary region among the channels of the (2-1)-th drive IC are shut down, and all channels of the (2-2)-th, (1-1)-th and (1-2)-th drive ICs are shut down.

When both the first and second screens are driven, channels connected to the data lines of the first screen and the first boundary region are driven in the (1-1)-th and (1-2)-th drive ICs, and channels connected to the data lines of the second screen and the second boundary region are driven in the (2-1)-th and (2-2)-th drive ICs.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A foldable display comprising:
   a flexible display panel including a first screen, a second screen, and a foldable boundary region positioned between the first screen and the second screen;
   a first drive IC connected to data lines of the first screen and connected to data lines of the first boundary region to drive pixels of the first screen and the first boundary region; and
   a second drive IC connected to data lines of the second screen and connected to data lines of the second boundary region to drive pixels of the second screen and the second boundary region,
   wherein channels of the first drive IC and channels of the second drive IC are driven and shutdown in accordance with status on whether the first and second screens are driven,
   when only the first screen among the first and second screens is driven, the first drive IC is configured to change gray scales of pixel data to be written to pixels outside a predetermined curved line to black gray scale in the first left corner pixel region and the first right corner pixel region.

2. The foldable display of claim 1, wherein, when both the first and second screens are simultaneously driven, all channels of the first drive IC connected to the data lines of the first screen and the first boundary region are driven, and all channels of the second drive IC connected to the data lines of the second screen and the second boundary region are driven.

3. The foldable display of claim 1, wherein the driving of the first screen and the second screen is controlled based on a posture or a folding degree of the flexible display panel or based on whether the first screen and the second screen are viewed by a user or based on a user input or command.

4. The foldable display of claim 1, wherein an enable signal is transmitted to the first and second drive ICs.

5. The foldable display of claim 4, wherein the enable signal includes a bit indicating whether the first screen is driven, a bit indicating whether the second screen is driven, and a bit indicating whether the first and second screens are simultaneously driven.

6. The foldable display of claim 1, wherein, when the first and second screens are simultaneously driven,
   the first drive IC is configured to change gray scales of pixel data to be written to pixels outside the predetermined curved line to black gray scale in a first left corner pixel region of the first screen distant from the foldable boundary region among the first left corner pixel region and a first right corner pixel region of the first screen neighboring the foldable boundary region, and
   the second drive IC is configured to change gray scales of pixel data to be written to pixels outside the predetermined curved line to black gray scale in a second right corner pixel region of the second screen distant from the foldable boundary region among the second right corner pixel region and a second left corner pixel region of the second screen neighboring the foldable boundary region.

7. The foldable display of claim 1, wherein, when only the second screen among the first and second screens is driven, the second drive IC is configured to change gray scales of pixel data to be written to pixels outside the predetermined curved line to black gray scale in the second left corner pixel region and the second right corner pixel region.

8. The foldable display of claim 1, further comprising:
   a first gate driver configured to provide gate signals to gate lines of the flexible display panel in response to a gate control signal from the first drive IC; and
   a second gate driver configured to provide gate signals to gate lines of the flexible display panel in response to a gate control signal from the second drive IC,
   wherein, when only the first screen among the first and second screens is driven, the first gate driver is driven and the second gate driver is shut down, and
   wherein, when only the second screen among the first and second screens is driven, the second gate driver is driven and the first gate driver is shut down.

9. The foldable display of claim 8, wherein, when the first and second screens are simultaneously driven, the first gate driver is configured to provide a gate signal at one end of each of the gate lines, the second gate driver is configured to provide the gate signal at the other end of each of the gate lines so that the gate signal is simultaneously applied to one gate line from both ends thereof.

10. The foldable display of claim 8, wherein, when both the first and second screens are simultaneously driven,
    channels of the (1-1)-th and (1-2)-th drive ICs connected to the data lines of the first screen and the first boundary region are driven, and
    channels of the (2-1)-th and (2-2)-th drive ICs connected to the data lines of the second screen and the second boundary region are driven.

11. The foldable display of claim 1, wherein the first screen includes a (1-1)-th screen close to the foldable boundary region and a (1-2)-th screen separated from the foldable boundary region having the (1-1)-th screen disposed therebetween,
    wherein the second screen includes a (2-1)-th screen close to the foldable boundary region and a (2-2)-th screen separated from the foldable boundary region having the (2-1)-th screen disposed therebetween,
    wherein the first driver includes a (1-1)-th drive IC connected to data lines of the (1-1)-th screen and connected to data lines of the first boundary region neighboring the first screen so as to drive pixels of the first screen and the first boundary region, and a (1-2)-th drive IC connected to data lines of the (1-2)-th screen so as to drive the (1-2)-th screen, and
    the second driver includes a (2-1)-th drive IC connected to data lines of the (2-1)-th screen and connected to data lines of the second boundary region neighboring the second screen to drive pixels of the second screen and the second boundary region, and a (2-2)-th drive IC connected to data lines of the (2-2)-th screen so as to drive the (2-2)-th screen, when only the first screen among the first and second screens is driven, channels connected to the data lines of the (1-1)-th screen (L1) among channels of the (1-1)-th drive IC are driven, and channels connected to the data lines of the first boundary region among the channels of the (1-1)-th drive IC are shut down, and channels of the (1-2)-th, (2-1)-th and (2-2)-th drive ICs are shut down, and wherein, when only the second screen between the first and second screens is driven, only channels connected to the data lines of the (2-1)-th screen among channels of the (2-1)-th drive IC are driven, channels connected to the data lines of the second boundary region among the channels of the (2-1)-th drive IC and channels of the (2-2)-th, (1-1)-th and (1-2)-th drive ICs are shut down.

12. The foldable display of claim 1, wherein, when only the first screen is driven, channels of the first drive IC connected to the data lines of the first screen is driven and channels of the first drive IC connected to the first boundary region, and the channels of the second drive IC are shut down.

13. The foldable display of claim 12, wherein, when only the second screen screens is driven, channels of the second drive IC connected to the data lines of the second screen are driven, and channels of the second drive IC connected to the second boundary region and the channels of the first drive IC are shut down.

14. A driving method for a foldable display, the foldable display comprising a flexible display panel including a first screen, a second screen, and a foldable boundary region positioned between the first screen and the second screen; a first drive IC connected to data lines of the first screen and connected to data lines of a first boundary region in the foldable boundary region neighboring the first screen to drive pixels of the first screen and the first boundary region; and a second drive IC connected to data lines of the second screen and connected to data lines of a second boundary region in the foldable boundary region neighboring the second screen to drive pixels of the second screen and the second boundary region, wherein the method comprises the following steps:

wherein, when only the first screen among the first and second screens is driven, driving channels of the first drive IC connected to the data lines of the first screen, and shutting down channels of the first drive IC connected to data lines of the first boundary region, and shutting down all channels of the second drive IC, and wherein, when only the second screen among the first and second screens is driven, driving channels of the second drive IC connected to the data lines of the second screen, and shutting down channels of the second drive IC connected to data lines of the second boundary region, and shutting down all channels of the first drive IC, when only the first screen among the first and second screens is driven, the first drive IC is configured to change gray scales of pixel data to be written to pixels outside a predetermined curved line to black gray scale in the first left corner pixel region and the first right corner pixel region.

15. A foldable display comprising:

a flexible display panel including a first screen, a second screen, and a foldable boundary region positioned between the first screen and the second screen;

a first drive IC connected to data lines of the first screen and connected to data lines of a first boundary region to drive pixels of the first screen and the first boundary region; and a second drive IC connected to data lines of the second screen and connected to data lines of a second boundary region to drive pixels of the second screen and the second boundary region, wherein, when only the first screen is driven, channels of the first drive IC connected to the data lines of the first screen are driven and channels of the first drive IC connected to the first boundary region, and all channels of the second drive IC are shut down, wherein, when only the second screen screens is driven, the channels of the second drive IC connected to the data lines of the second screen are driven, and the channels of the second drive IC connected to data lines of the second boundary region and all channels of the first drive IC are shut down, wherein, when both the first and second screens are simultaneously driven, all channels of the first drive IC connected to the data lines of the first screen and the first boundary region are driven, and all channels of the second drive IC connected to the data lines of the second screen and the second boundary region are driven, and when only the first screen among the first and second screens is driven, the first drive IC is configured to change gray scales of pixel data to be written to pixels outside a predetermined curved line to black gray scale in the first left corner pixel region and the first right corner pixel region.

16. The foldable display of claim 15, wherein the driving of the first screen and the second screen is controlled based on a posture or a folding degree of the flexible display panel or based on whether the first screen and the second screen are viewed by a user or based on a user input or command.

17. The foldable display of claim 15, wherein an enable signal is transmitted to the first and second drive ICs.

18. The foldable display of claim 17, wherein the enable signal includes a bit indicating whether the first screen is driven, a bit indicating whether the second screen is driven, and a bit indicating whether the first and second screens are simultaneously driven.

19. The foldable display of claim 15, wherein, when the first and second screens are simultaneously driven, the first drive IC is configured to change gray scales of pixel data to be written to pixels outside the predetermined curved line to black gray scale in a first left corner pixel region of the first screen distant from the foldable boundary region among the first left corner pixel region and a first right corner pixel region of the first screen neighboring the foldable boundary region, and the second drive IC is configured to change gray scales of pixel data to be written to pixels outside the predetermined curved line to black gray scale in a second right corner pixel region of the second screen distant from the foldable boundary region among the second right corner pixel region and a second left corner pixel region of the second screen neighboring the foldable boundary region.

* * * * *